(12) United States Patent
Yamazaki et al.

(10) Patent No.: US 10,230,002 B2
(45) Date of Patent: *Mar. 12, 2019

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Hideomi Suzawa, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/597,237

(22) Filed: May 17, 2017

(65) Prior Publication Data

US 2017/0323974 A1 Nov. 9, 2017

Related U.S. Application Data

(63) Continuation of application No. 14/722,260, filed on May 27, 2015, now Pat. No. 9,660,097, which is a
(Continued)

(30) Foreign Application Priority Data

Apr. 30, 2012 (JP) .................. 2012-104286

(51) Int. Cl.
*H01L 29/12* (2006.01)
*H01L 29/786* (2006.01)
(Continued)

(52) U.S. Cl.
CPC ...... *H01L 29/7869* (2013.01); *H01L 29/4908* (2013.01); *H01L 29/517* (2013.01); *H01L 29/518* (2013.01); *H01L 29/78648* (2013.01)

(58) Field of Classification Search
CPC ............ H01L 29/7869; H01L 29/4908; H01L 29/78648; H01L 29/517
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Theresa T Doan
(74) *Attorney, Agent, or Firm* — Fish & Richardson P.C.

(57) ABSTRACT

A transistor that is to be provided has such a structure that a source electrode layer and a drain electrode layer between which a channel formation region is sandwiched has regions projecting in a channel length direction at lower end portions, and an insulating layer is provided, in addition to a gate insulating layer, between the source and drain electrode layers and a gate electrode layer. In the transistor, the width of the source and drain electrode layers is smaller than that of an oxide semiconductor layer in the channel width direction, so that an area where the gate electrode layer overlaps with the source and drain electrode layers can be
(Continued)

made small. Further, the source and drain electrode layers have regions projecting in the channel length direction at lower end portions.

22 Claims, 12 Drawing Sheets

Related U.S. Application Data continuation of application No. 13/868,420, filed on Apr. 23, 2013, now Pat. No. 9,048,323.

(51) Int. Cl.
*H01L 29/49* (2006.01)
*H01L 29/51* (2006.01)

(58) Field of Classification Search
USPC ..................................... 257/43, 59; 438/85
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,112,818 B2 | 9/2006 | Kimura |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,915,075 B2 | 3/2011 | Suzawa et al. |
| 7,994,500 B2 | 8/2011 | Kim et al. |
| 8,039,835 B2 | 10/2011 | Ichikiwa et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,501,564 B2 | 8/2013 | Suzawa et al. |
| 8,823,074 B2 | 9/2014 | Suzawa et al. |
| 8,912,040 B2 | 12/2014 | Suzawa et al. |
| 9,048,323 B2 | 6/2015 | Yamazaki et al. |
| 9,064,967 B2 | 6/2015 | Suzawa et al. |
| 9,373,525 B2 | 6/2016 | Suzawa et al. |
| 9,660,097 B2 * | 5/2017 | Yamazaki ............ H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0052230 A1 | 3/2006 | Masuda |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0176383 A1 | 7/2010 | Park et al. |
| 2010/0200843 A1 * | 8/2010 | Arai ................... H01L 27/3262 257/40 |
| 2010/0320458 A1 | 12/2010 | Umeda et al. |
| 2010/0320459 A1 | 12/2010 | Umeda et al. |
| 2011/0089414 A1 | 4/2011 | Yamazaki et al. |
| 2011/0092017 A1 | 4/2011 | Akimoto et al. |
| 2011/0109351 A1 | 5/2011 | Yamazaki et al. |
| 2011/0127523 A1 * | 6/2011 | Yamazaki ......... H01L 21/02554 257/43 |
| 2011/0127524 A1 | 6/2011 | Yamazaki et al. |
| 2011/0180796 A1 | 7/2011 | Yamazaki et al. |
| 2011/0193083 A1 | 8/2011 | Kim et al. |
| 2011/0215328 A1 | 9/2011 | Morosawa et al. |
| 2012/0025191 A1 | 2/2012 | Yamazaki |
| 2012/0032172 A1 | 2/2012 | Noda et al. |

(56) References Cited

U.S. PATENT DOCUMENTS

| 2012/0112184 A1 | 5/2012 | Yamazaki et al. |
| 2012/0119205 A1 | 5/2012 | Taniguchi et al. |
| 2012/0193625 A1 | 8/2012 | Sasagawa et al. |
| 2013/0277676 A1 | 10/2013 | Yamazaki |
| 2016/0284739 A1 | 9/2016 | Suzawa et al. |
| 2017/0278976 A1 | 9/2017 | Noda et al. |

FOREIGN PATENT DOCUMENTS

| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-018006 A | 1/1997 |
| JP | 11-097699 A | 4/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-319683 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-211144 A | 8/2006 |
| JP | 2007-096055 A | 4/2007 |
| JP | 2007-123861 A | 5/2007 |
| JP | 2008-153535 A | 7/2008 |
| JP | 2008-211144 A | 9/2008 |
| JP | 2009-231613 A | 10/2009 |
| JP | 2010-016347 A | 1/2010 |
| JP | 2010-021170 A | 1/2010 |
| JP | 2010-034139 A | 2/2010 |
| JP | 4415062 | 2/2010 |
| JP | 2010-067954 A | 3/2010 |
| JP | 2010-123923 A | 6/2010 |
| JP | 2010-177431 A | 8/2010 |
| JP | 4571221 | 10/2010 |
| JP | 2010-267752 A | 11/2010 |
| JP | 2011-103458 A | 5/2011 |
| JP | 2011-139055 A | 7/2011 |
| JP | 2011-171721 A | 9/2011 |
| JP | 2012-049514 A | 3/2012 |
| JP | 2012-054544 A | 3/2012 |
| JP | 2012-160679 A | 8/2012 |
| WO | WO-2004/114391 | 12/2004 |
| WO | WO-2008/133345 | 11/2008 |
| WO | WO-2011/068028 | 6/2011 |
| WO | WO-2012/014786 | 2/2012 |

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Application", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Tehnial Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

(56) References Cited

OTHER PUBLICATIONS

Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06: Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07: SID International Symposium Digest of Technical Papers, 2007, vol. 38, pp. 1673-1676.
Mo.Y et al., "Amorphous Oxide TFT Backplanes for Large Size AMOLED Displays", IDW '08: Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09: SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09: SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. ( Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09: Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

\* cited by examiner

SEMICONDUCTOR DEVICE

CROSS-REFERENCE TO RELATED APPLICATIONS

This application is a continuation of U.S. application Ser. No. 14/722,260, filed May 27, 2015, now allowed, which is a continuation of U.S. application Ser. No. 13/868,420, filed Apr. 23, 2013, now U.S. Pat. No. 9,048,323, which claims the benefit of a foreign priority application filed in Japan as Serial No. 2012-104286 on Apr. 30, 2012, all of which are incorporated by reference.

BACKGROUND OF THE INVENTION

1. Field of the Invention

The invention disclosed in this specification and the like relates to a semiconductor device and a manufacturing method thereof.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which transistors are formed using semiconductor thin films over a substrate having an insulating surface has been attracting attention. The transistor is applied to a wide range of semiconductor electronic devices such as an integrated circuit (IC) and an image display device (also simply referred to as display device). A silicon-based semiconductor material is widely known as a material for a semiconductor thin film applicable to a transistor. As another material, an oxide semiconductor has been attracting attention.

For example, a technique by which a transistor is manufactured using zinc oxide or an In—Ga—Zn-based oxide as an oxide semiconductor is disclosed (see Patent Documents 1 and 2).

Further, Patent Document 3 discloses a transistor structure as follows: the transistor includes a source electrode and a drain electrode in contact with an oxide semiconductor layer, a gate electrode overlapping with the oxide semiconductor layer, and a gate insulating layer between the oxide semiconductor layer and the gate electrode; and the source electrode and the drain electrode includes a first conductive layer and a second conductive layer having a region which extends in a channel length direction beyond an end portion of the first conductive layer.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-171721

SUMMARY OF THE INVENTION

In order to achieve high speed operation of a transistor, miniaturization of the transistor is needed. However, in a miniaturized transistor, the electric field applied to the transistor, particularly, applied to end portions of a source electrode layer and a drain electrode layer is increased. Thus, a transistor structure which enables the electric field to be relaxed is needed.

In addition, in order to achieve high speed operation of the transistor, a reduction in parasitic capacitance which is possibly generated between a gate electrode layer and the source or drain electrode layer is needed.

In view of the above, an object of one embodiment of the present invention is to provide a transistor structure which includes an oxide semiconductor and enables relaxation of the electric field concentration which is possibly generated at end portions of a source electrode layer and a drain electrode layer.

Another object of one embodiment of the present invention is to provide a transistor structure which includes an oxide semiconductor and enables a reduction in parasitic capacitance which is possibly generated between a gate electrode layer and a source or drain electrode layer.

Another object of one embodiment of the present invention is to provide a transistor which includes an oxide semiconductor and enables miniaturization and excellent electric characteristics.

Each embodiment of the invention disclosed in this specification achieves at least one of the above objects.

A transistor provided in accordance with one embodiment of the present invention has such a structure in which a source electrode layer and a drain electrode layer between which a channel formation region is sandwiched has regions projecting in the channel length direction at lower end portions, and another insulating layer is provided in addition to a gate insulating layer between the source and drain electrode layers and a gate electrode layer. In the transistor, the width of the source and drain electrode layers in the channel width direction is smaller than that of the oxide semiconductor layer, whereby an area where the gate electrode layer overlaps with the source and drain electrode layers is made small so that parasitic capacitance can be reduced. Further, with the regions projecting in the channel length direction at the lower end portions of the source and drain electrode layers, the electric field concentration can be relaxed. Further, with the above insulating layer, the parasitic capacitance between the gate electrode layer and the source and drain electrode layers can be reduced. Specifically, the following structure can be employed for example.

One embodiment of the present invention is a semiconductor device including an island-shaped oxide semiconductor layer, a source electrode layer and a drain electrode layer which includes a single conductive layer and is over and in contact with the oxide semiconductor layer, an insulating layer which has an opening and covers the source electrode layer and the drain electrode layer, a gate insulating layer which is over the insulating layer and in contact with a part of the oxide semiconductor layer, and a gate electrode layer which overlaps with the oxide semiconductor layer, the source electrode layer, and the drain electrode layer with the gate insulating layer interposed therebetween. The source electrode layer and the drain electrode layer have regions projecting in the channel length direction at lower end portions. The lower end portions of the source electrode layer and the drain electrode layer in a region overlapping with the gate electrode layer are positioned over the oxide semiconductor layer. In the channel length direction, the width of the opening in the insulating layer is larger than a distance between the source electrode layer and the drain electrode layer and is smaller than the width of the gate electrode layer. In the channel width direction, the width of the opening in the insulating layer is smaller than the width of the source electrode layer and the drain electrode layer.

In the oxide semiconductor layer in the above semiconductor device, a thickness of a region in contact with the gate insulating layer is smaller than a thickness of a region which overlaps with the gate electrode layer and is in contact with the source or drain electrode layer.

Further, in the above semiconductor device, an oxide insulating layer containing at least one of metal elements selected from constituent elements of the oxide semiconductor layer is preferably provided to be in contact with a lower part of the oxide semiconductor layer. The oxide insulating layer is preferably an oxide insulating layer containing gallium oxide. Furthermore, a conductive layer overlapping with the oxide semiconductor layer with the oxide insulating layer interposed therebetween is preferably provided.

In the above semiconductor device, the gate insulating layer is preferably an oxide insulating layer containing at least one of metal elements selected from the constituent elements of the oxide semiconductor layer.

In this specification and the like, the expression "substantially same" does not necessarily mean being exactly the same. For example, the expression "substantially aligned" includes a degree of alignment in a shape obtained by etching a plurality of layers with the same mask.

According to one embodiment of the present invention, a transistor structure which includes an oxide semiconductor and enables relaxation of the electric field which is possibly generated at end portions of a source electrode layer and a drain electrode layer can be provided.

Further, according to one embodiment of the present invention, a transistor structure which includes an oxide semiconductor and enables a reduction in parasitic capacitance generated between a gate electrode layer and a source or drain electrode layer can be provided.

Furthermore, according to one embodiment of the present invention, a transistor which includes an oxide semiconductor and enables miniaturization and excellent electric characteristics can be provided.

DETAILED DESCRIPTION OF THE INVENTION

Figure 1A:
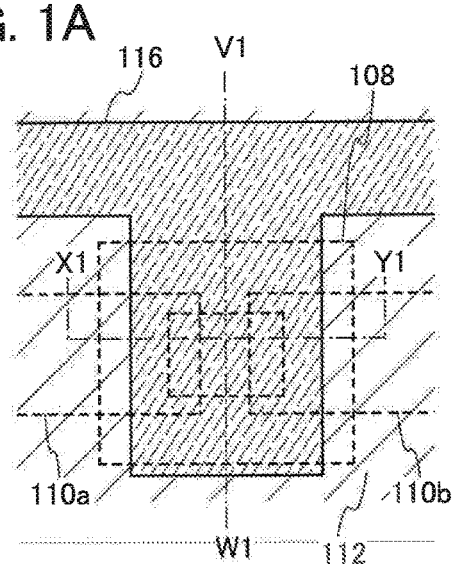
FIGS. 1A to 1C are a plan view and cross-sectional views illustrating one embodiment of a semiconductor device.

Hereinafter, embodiments of the present invention will be described in detail with reference to the accompanying drawings. Note that the present invention is not limited to the description below and it is easily understood by those skilled in the art that the mode and details can be changed in various ways. Therefore, the invention should not be construed as being limited to the description in the following embodiments.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, embodiments of the present invention are not limited to such scales.

Note that the ordinal numbers such as "first", "second", and the like in this specification and the like are used for convenience and do not denote the order of steps or the stacking order of layers. In addition, the ordinal numbers in this specification do not denote particular names which specify the present invention.

(Embodiment 1)

In this embodiment, one embodiment of a semiconductor device and a method for manufacturing the semiconductor device will be described with reference to FIGS. 1A to 1C, FIGS. 2A to 2C, FIGS. 3A to 3D, and FIGS. 4A to 4E. In this embodiment, a transistor including an oxide semiconductor layer is described as an example of the semiconductor device.

Figure 1C:
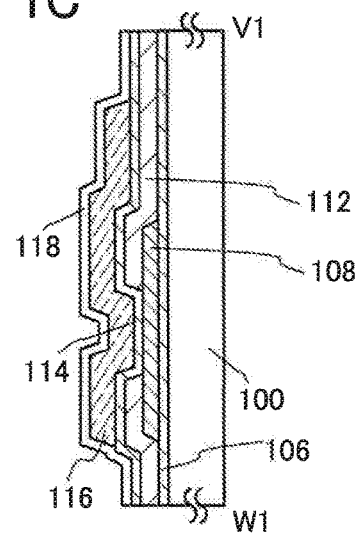
Figure 1B:
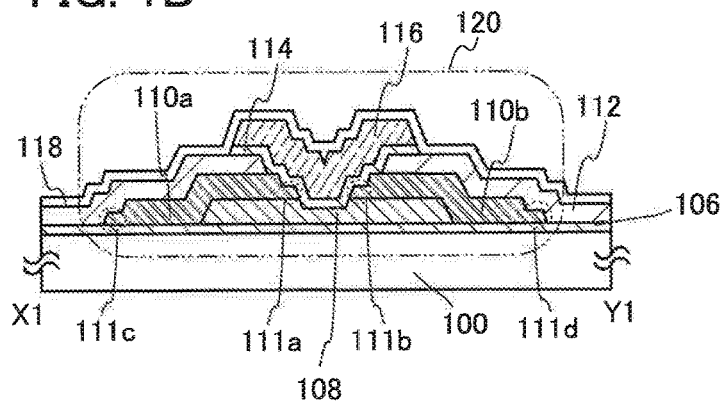

FIGS. 1A to 1C illustrate a structure example of a transistor 120. FIG. 1A is a plan view of the transistor 120, FIG. 1B is a cross-sectional view taken along dotted line X1-Y1 in FIG. 1A, and FIG. 1C is a cross-sectional view taken along dotted line V1-W1 in FIG. 1A.

As illustrated in FIG. 1B, the transistor 120 includes, over an oxide insulating layer 106 provided on a substrate 100 having an insulating surface, an island-shaped oxide semiconductor layer 108, a source electrode layer 110a and a drain electrode layer 110b over and in contact with the oxide semiconductor layer 108, an insulating layer 112 which has an opening and covers the source electrode layer 110a and the drain electrode layer 110b, a gate insulating layer 114 provided over the insulating layer 112 to be in contact with part of the oxide semiconductor layer 108, and a gate electrode layer 116 which overlaps with the oxide semiconductor layer 108, the source electrode layer 110a, and the drain electrode layer 110b with the gate insulating layer 114 interposed therebetween. In addition, an insulating layer 118 provided over the gate electrode layer 116 may be included in component of the transistor 120.

In the transistor 120, the source electrode layer 110a and the drain electrode layer 110b is formed using a single metal layer. In steps of forming the source electrode layer 110a and the drain electrode layer 110b, etching treatment is performed plural times, whereby regions 111a and 111b projecting in the channel length direction are formed at lower end portions in contact with a channel formation region. Further, the gate insulating layer 114 is provided to be in contact with the regions 111a and 111b and part of the oxide semiconductor layer 108.

In a general top-gate transistor, a gate insulating layer has steps caused by the thickness of source and drain electrode layers in regions where the gate insulating layer covers end portions of the source and drain electrode layers, and the thickness of the gate insulating layer in the step portion is locally small as compared with that of the other region. Since withstand voltage is low in such a thin region, an electric field might concentrate on the region, whereby breakdown of a transistor may be caused. In addition, the thin region might cause gate leakage. With miniaturization of the transistor, the difference in thickness between a wiring layer and a gate insulating layer is increased, which causes the above problem noticeably.

However, in the transistor 120, projecting regions with a small thickness (111a and 111b) are provided at the lower end portions of the source electrode layer 110a and the drain electrode layer 110b in contact with the channel formation region, so that the thicknesses of regions around edges of the source and drain electrode layers 110a and 110b are decreased gradually, and the gate insulating layer 114 is formed to cover the regions. With the projecting regions, a region with a small thickness can be prevented from being formed locally in the gate insulating layer 114, and thus, the concentration of electric field can be relaxed. Therefore, the withstand voltage of the transistor 120 can be improved, and generation of the gate leakage current can be suppressed. In addition, coverage with the gate insulating layer 114 can be improved, and disconnection or poor connection can be prevented.

Note that the regions 111a and 111b of the source electrode layer 110a and the drain electrode layer 110b are formed through etching treatment performed plural times in the process of forming the source electrode layer 110a and the drain electrode layer 110b. Through the etching treatment, regions (a region 111c and a region 111d in FIG. 1B) projecting in the channel width direction are formed at the lower end portions of the source electrode layer 110a and the drain electrode layer 110b in the channel width direction.

The insulating layer 112 is provided to cover the source electrode layer 110a and the drain electrode layer 110b and has an opening in a region overlapping with the channel formation region. With the insulating layer 112, parasitic capacitance generated between the gate electrode layer 116 and the source and drain electrode layers 110a and 110b can be reduced. As illustrated in FIG. 1A, in the channel length direction, the width of the opening is larger than the distance between the source electrode layer 110a and the drain electrode layer 110b and is smaller than the width of the gate electrode layer 116. Further, in the channel width direction, the width of the opening is smaller than the width of the source electrode layer 110a and the drain electrode layer 110b.

As illustrated in FIG. 1A, in the channel width direction, the width of the source electrode layer 110a and the drain electrode layer 110b in a region overlapping with the gate electrode layer 116 is smaller than the width of the oxide semiconductor layer 108. In other words, the lower end portions of the source electrode layer 110a and the drain electrode layer 110b in a region overlapping with the gate electrode layer 116 are positioned over the oxide semiconductor layer 108. With such a structure, an area where the gate electrode layer 116 overlaps with the source electrode layer 110a and the drain electrode layer 110b can be made small, which further suppresses generation of parasitic capacitance.

In the oxide semiconductor layer 108 included in the transistor 120, a region in contact with the gate insulating layer 114 has a smaller thickness than regions in contact with the source electrode layer 110a and the drain electrode layer 110b. The region with a small thickness can be formed by etching part of the oxide semiconductor layer 108 in the process of a conductive film that is to be the source electrode layer 110a and the drain electrode layer 110b or by etching an exposed region of the oxide semiconductor layer 108 after the source electrode layer 110a and the drain electrode layer 110b are formed. The region with a small thickness functions as a channel formation region in the transistor 120. The regions in contact with the source electrode layer 110a and the drain electrode layer 110b can have lower resistance than the channel formation region when the thickness of the channel formation region is small. Thus, a contact resistance between such regions and the source electrode layer 110a and the drain electrode layer 110b can be reduced.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) film, and the like.

The amorphous oxide semiconductor layer has disordered atomic arrangement and no crystalline component. A typical example thereof is an oxide semiconductor layer in which no crystal part exists even in a microscopic region, and the whole of the film is amorphous.

The microcrystalline oxide semiconductor layer includes a microcrystal (also referred to as nanocrystal) with a size greater than or equal to 1 nm and less than 10 nm, for example Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS film is one of oxide semiconductor layers including a plurality of crystal parts, and most of the crystal parts each fits inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor layer. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor layer of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° is derived from the (311) plane of a $ZnGa_2O_4$ crystal; such a peak indicates that a $ZnGa_2O_4$ crystal is included in part of the CAAC-OS film including the $InGaZnO_4$ crystal. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that the oxide semiconductor layer 108 may have any of the above structured, for example, may be a stacked film including two or more layers of an amorphous oxide semiconductor layer, a microcrystalline oxide semiconductor layer, and a CAAC-OS film, for example.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

The insulating layers in contact with the oxide semiconductor layer 108 (the oxide insulating layer 106 and the gate insulating layer 114) preferably includes a region containing oxygen in excess of the stoichiometric composition (hereinafter, referred to as oxygen excess region). When the insulating layers in contact with the oxide semiconductor layer 108 include an oxygen excess region, oxygen can be supplied to the oxide semiconductor layer 108. Thus, elimination of oxygen from the oxide semiconductor layer 108 can be prevented, and oxygen vacancies can be filled. As a result, a shift of the threshold voltage of the transistor 120 in the negative direction can be suppressed, and reliability can be improved.

As each of the insulating layers in contact with the oxide semiconductor layer 108 (the oxide insulating layer 106 and the gate insulating layer 114), an oxide insulating layer containing at least one of metal elements selected from constituent elements of the oxide semiconductor layer 108 is preferably used. For example, an oxide insulating layer containing gallium is preferably used. Examples of such an oxide insulating film include a gallium oxide film (also referred to as $GaO_x$; x is not necessarily a natural number but includes a non-natural number), a gallium zinc oxide film (also referred to as $Ga_2Zn_xO_y$, (x=1 to 5)), a $Ga_2O_3$ ($Gd_2O_3$) film, and an insulating In—Ga—Zn-based oxide film in which the gallium content is high and the indium content is low.

For example, as the oxide semiconductor layer 108, a semiconductor layer containing gallium such as an In—Ga—Zn-based oxide semiconductor layer is used, and oxide insulating layers containing gallium (e.g., gallium oxide films) are formed in contact with an upper surface and a lower surface of the oxide semiconductor layer so that the oxide semiconductor layer is sandwiched therebetween. In that case, the oxide insulating layers provided over and below the oxide semiconductor layer contain the same constituent elements as the oxide semiconductor layer; thus, the interface states between the oxide semiconductor layer and the oxide insulating layers can be made favorable. As a result, the transistor can obtain stable electric characteristics. Further, when the oxide insulating layers containing at least one of metal elements selected from constituent elements of the oxide semiconductor layer are provided in contact with an upper surface and a lower surface of the oxide semiconductor layer so that the oxide semiconductor layer is sandwiched therebetween, the oxide insulating layers can have a function of blocking entry of impurities which might affect the oxide semiconductor layer (e.g., nitrogen, a metal element, or the like) diffused from the outside. Accordingly, when the oxide insulating layers are provided so that the oxide semiconductor layer is sandwiched or surrounded, the composition of the surrounded oxide semiconductor layer and the purity thereof can be kept constant, and a semiconductor device with stable electric characteristics can be achieved.

Figure 2A:
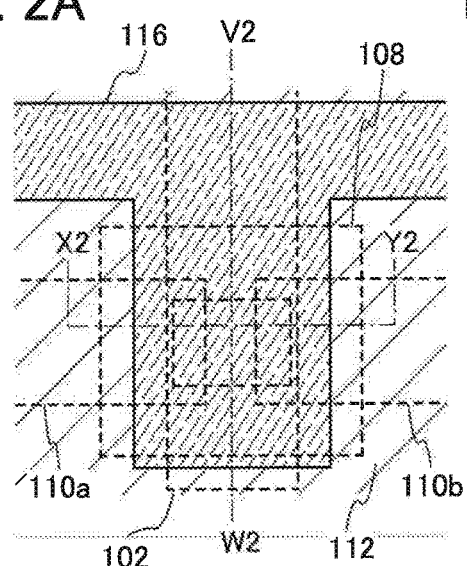
FIGS. 2A to 2C are a plan view and cross-sectional views illustrating one embodiment of a semiconductor device.
Figure 2C:
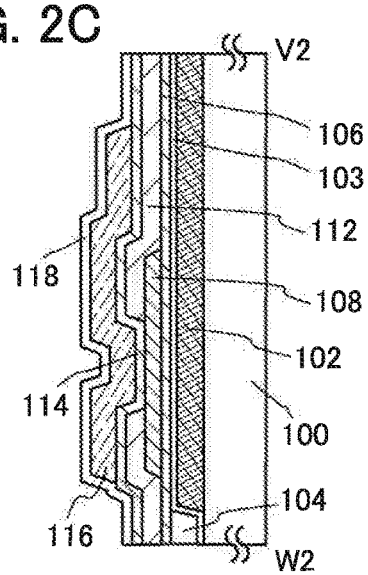
Figure 2B:
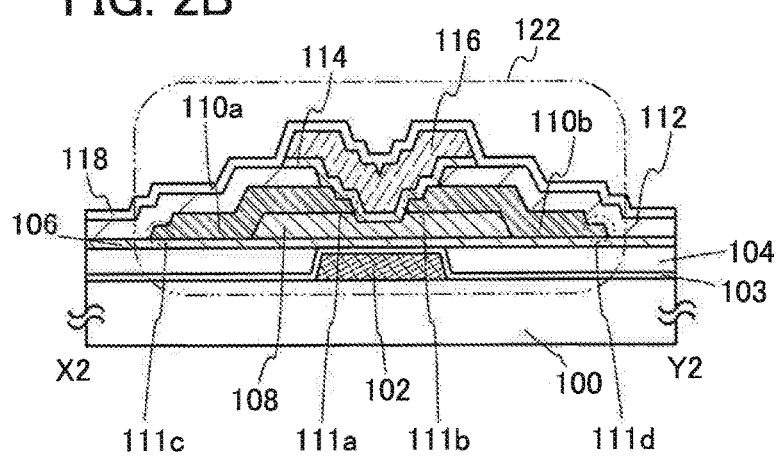

FIGS. 2A to 2C illustrate a structure example of a transistor 122 in accordance with this embodiment. FIG. 2A is a plan view of the transistor 122, FIG. 2B is a cross-sectional view taken along dotted line X2-Y2 in FIG. 2A, and FIG. 2C is a cross-sectional view taken along dotted line V2-W2 in FIG. 2A.

The transistor 122 illustrated in FIGS. 2A to 2C is different from the transistor 120 in that a conductive layer 102 is provided between the oxide insulating layer 106 and the substrate 100 to overlap with the oxide semiconductor layer 108, an insulating layer 103 is provided over the conductive layer 102, and an insulating layer 104 in which the conductive layer 102 is embedded is provided. The other components are similar to those of the transistor 120, and thus detailed description of the same portions is omitted.

In the transistor 122, the conductive layer 102 is an electrode layer functioning as a so-called back gate, and the potential thereof can be adjusted as appropriate. By controlling the gate voltage applied to the back gate, the threshold voltage of the transistor 122 can be controlled, so that a normally-off transistor can be obtained.

FIGS. 3A to 3D illustrate other structure examples of transistors of this embodiment.

Figure 3A:
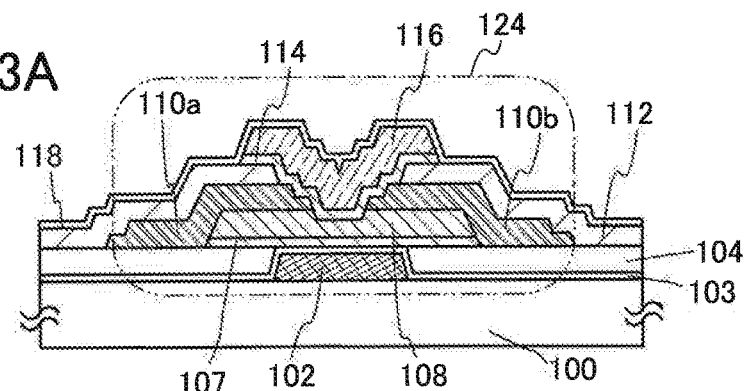
FIGS. 3A to 3D are cross-sectional views each illustrating one embodiment of a semiconductor device.

A difference between a transistor 124 illustrated in FIG. 3A and the transistor 122 illustrated in FIGS. 2A to 2C is a shape of the oxide insulating layer in contact with a lower part of the oxide semiconductor layer 108. The transistor 124 includes an oxide insulating layer 107 processed into an island shape. The oxide insulating layer 107 can be formed using a material and method similar to those of the oxide insulating layer 106, and it is preferably an oxide insulating layer containing at least one of metal elements selected from the constituent elements of the oxide semiconductor layer 108. The oxide insulating layer 107 can be processed by etching with use of a photomask which is used at the same time for processing the oxide semiconductor layer 108 into an island shape. The patterned shape of the oxide insulating layer 107 (not illustrated) viewed from above is substantially aligned with the shape of the oxide semiconductor layer. Accordingly, the structure illustrated in FIG. 3A can be obtained without an increase or a decrease in the number of masks compared with the case of the transistor 122 in FIGS. 2A to 2C. In the transistor 124, structures other than the oxide insulating layer 107 are similar to those of the transistor 122, and thus detailed description of the same portions is omitted.

Figure 3B:
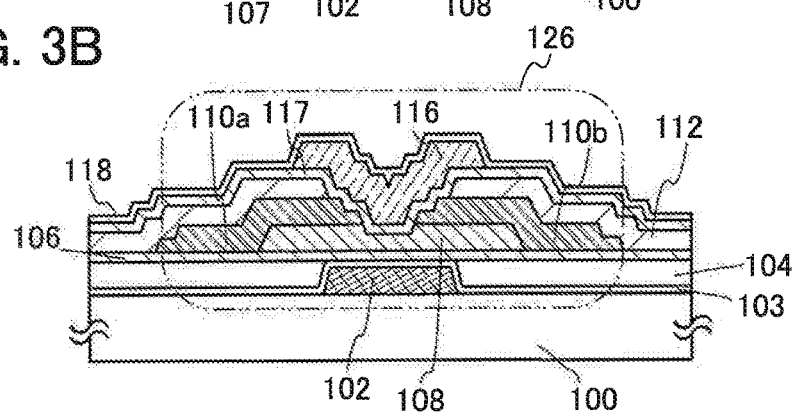

A difference between a transistor 126 illustrated in FIG. 3B and the transistor 122 illustrated in FIGS. 2A to 2C is a shape of the gate insulating layer. In the transistor 126, a gate insulating layer 117 is not patterned, which is formed to cover the entire surface of the insulating layer 112. The gate insulating layer 117 can be formed using a material and method similar to those of the gate insulating layer 114. Note that in the transistor 122 illustrated in FIGS. 2A to 2C, the gate insulating layer 114 is patterned with use of a photomask which is also used for forming the gate electrode layer 116. Thus, the number of masks used for forming the transistor 122 is the same as that used for forming the transistor 126. In the transistor 126, structures other than the gate insulating layer 117 are similar to those of the transistor 122, and thus detailed description of the same portions is omitted.

Figure 3C:
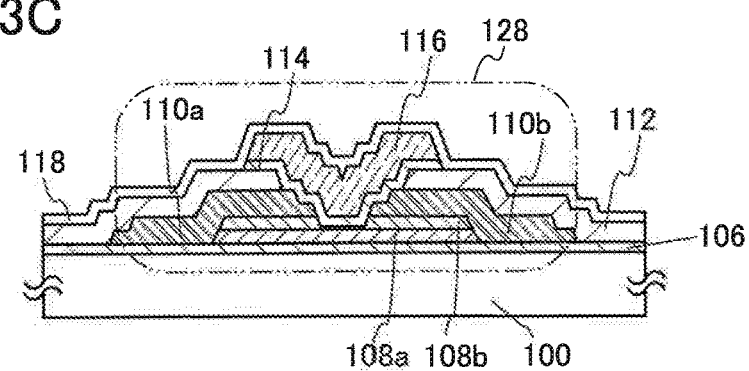

A difference between a transistor 128 illustrated in FIG. 3C and the transistor 120 illustrated in FIGS. 1A to 1C is a structure of the oxide semiconductor layer. In the transistor 128, the oxide semiconductor layer is a stacked layer including an oxide semiconductor layer 108a over and in contact with the oxide insulating layer 106 and an oxide semiconductor layer 108b over and in contact with the oxide semiconductor layer 108a. In the transistor 128, structures other than the oxide semiconductor layer 108a and the oxide semiconductor layer 108b are similar to those of the transistor 120, and thus detailed description of the same portions is omitted.

The oxide semiconductor layer 108a and the oxide semiconductor layer 108b may be formed using metal oxides with different compositions. For example, the oxide semiconductor layer 108a may be formed using a three-component metal oxide, and the oxide semiconductor layer 108b may be formed using a two-component metal oxide. Alternatively, both the oxide semiconductor layer 108a and the oxide semiconductor layer 108b may be formed using a three-component metal oxide. Further, the constituent elements of the oxide semiconductor layer 108a and the oxide semiconductor layer 108b are made to be the same and the composition of the constituent elements of the oxide semiconductor layer 108a and the oxide semiconductor layer 108b may be made to be different. Note that the oxide semiconductor layer may have a stacked structure including three or more layers.

Note that as the oxide semiconductor layer 108b, it is preferable to use an oxide semiconductor which contains at least indium (In) and gallium (Ga) and has the following relation of the content, In≤Ga. Further, in Ga, the formation energy of oxygen vacancy is larger and thus oxygen vacancy is less likely to occur, than in In; therefore, the oxide having a composition where In≤Ga has more stable characteristics than the oxide having a composition where In>Ga. With use of such a material, the reliability of the transistor can be improved.

Further, as the oxide semiconductor layer 108a, it is preferable to use an oxide semiconductor which contains at least indium (In) and gallium (Ga) and has the following relation of the content, In>Ga. In an oxide semiconductor, the s orbital of heavy metal mainly contributes to carrier transfer, and when the In content in the oxide semiconductor is increased, overlap of the s orbitals is likely to be increased. Therefore, an oxide having a composition where In>Ga has higher mobility than an oxide having a composition where In≤Ga.

Note that when the oxide semiconductor layer has a stacked structure, the oxide semiconductor layer is formed so that the lower layer of the stacked layer (the oxide semiconductor layer 108a in FIG. 3C) is not exposed through the step of thinning the channel formation region (step of patterning the source electrode layer 110a and the drain electrode layer 110b or etching treatment performed after the patterning).

Figure 3D:
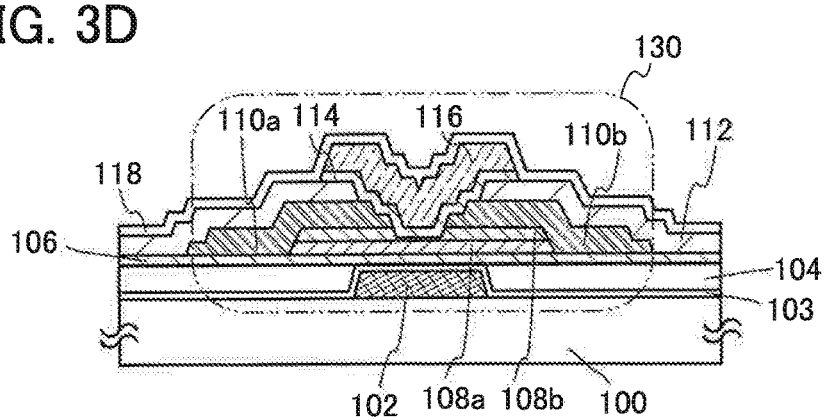

A difference between a transistor 130 illustrated in FIG. 3D and the transistor 122 illustrated in FIGS. 2A to 2C is a structure of the oxide semiconductor layer. In the transistor 130, the oxide semiconductor layer has a stacked structure including an oxide semiconductor layer 108a in contact with the oxide insulating layer 106 and an oxide semiconductor layer 108b over and in contact with the oxide semiconductor layer 108a. In the transistor 130, structures other than the oxide semiconductor layer are similar to those of the transistor 122, and thus detailed description of the same portions is omitted. Further, structures of the oxide semiconductor layer 108a and the oxide semiconductor layer 108b are similar to those in the transistor 128.

The structures of the transistors illustrated in FIGS. 1A to 1C, FIGS. 2A to 2C, and FIGS. 3A to 3D are partly different from each other. One embodiment of the present invention is not particularly limited to any of the structures, and a variety of combinations of the structures can be made. For example, a transistor may have a structure in which the patterned oxide insulating layer 107 in FIG. 3A and a stacked structure of the oxide semiconductor layer 108a and the oxide semiconductor layer 108b in FIG. 3D are provided.

An example of a method for manufacturing the transistor 122 is described below with reference to FIGS. 4A to 4E and FIGS. 5A to 5E.

First, the conductive layer 102 is formed over the substrate 100 having an insulating surface.

There is no particular limitation on the substrate that can be used as the substrate 100 having an insulating surface as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Furthermore, any of these substrates further provided with a semiconductor element may be used as the substrate 100.

The conductive layer 102 can be formed using a metal material such as molybdenum, titanium, tantalum, tungsten, aluminum, copper, chromium, neodymium, scandium, or the like, or an alloy material which contains any of these materials as its main component. Alternatively, a semiconductor film typified by a polycrystalline silicon film doped with an impurity element such as phosphorus, or a silicide film such as a nickel silicide film may be used as the conductive layer 102. Note that the conductive layer 102 may have a single-layer structure or a stacked structure. The conductive layer 102 may have a tapered shape with a taper angle more than or equal to 30° and less than or equal to 70° for example. Here, the taper angle refers to an angle formed between a side surface of a layer having a tapered shape and a bottom surface of the layer.

Further alternatively, the conductive layer 102 can be formed using a conductive material such as indium oxide-tin oxide, indium oxide including tungsten oxide, indium zinc oxide including tungsten oxide, indium oxide including titanium oxide, indium tin oxide including titanium oxide, indium oxide-zinc oxide, or indium tin oxide to which silicon oxide is added.

For the conductive layer 102, at least on the side of a surface in contact with the insulating layer 103, a material with a higher work function than the oxide semiconductor layer 108 is preferably used. It is further preferable to use a material with a higher work function by 1 eV or higher than the oxide semiconductor layer 108. For example, as the material, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (such as an indium nitride film, a zinc nitride film, a tantalum nitride film, or a tungsten nitride film) is preferably used. These films each have a work function of 5 eV or higher; thus, the threshold voltage of the transistor can be positive as the electric characteristics. Accordingly, a so-called normally-off switching transistor can be obtained. For example, in the case where an In—Ga—Zn—O film containing nitrogen is used, an In—Ga—Zn—O film containing nitrogen at higher concentration than at least that in the oxide semiconductor layer 108 may be used.

Next, the insulating layer 103 is formed over the conductive layer 102 to cover the conductive layer 102. The insulating layer 103 can be formed by a CVD method, a sputtering method, or the like to have a single-layer structure or a stacked structure using silicon oxide, silicon oxynitride, aluminum oxide, aluminum oxynitride, hafnium oxide, gallium oxide, zinc gallium oxide, or a mixed material of these materials.

Note that the insulating layer 103 is processed in a later step to be in contact with the oxide insulating layer 106. Since the oxide insulating layer 106 in contact with the oxide semiconductor layer 108 preferably includes an oxygen excess region, a film having barrier properties against oxygen is preferably used for the insulating layer 103, so that a release of oxygen from the oxide insulating layer 106 is prevented. As the film having barrier properties against oxygen, a film with less permeability of oxygen than at least the oxide insulating layer 106 is preferably used. For example, a single layer or a stacked layer of an oxide or nitride film including aluminum, an oxide or nitride film including aluminum to which magnesium is added, an oxide or nitride film including aluminum to which titanium is added, an oxide or nitride film including magnesium, or an oxide or nitride film including titanium can be used. As the insulating layer 103, in addition to having barrier properties against oxygen, a film which has less permeability of impurities such as hydrogen and moisture is preferably used. As such a film, an aluminum oxide film can be preferably used. With use of an aluminum oxide film as the insulating layer 103, a release of oxygen can be prevented, and in addition, entry of impurities such as hydrogen and moisture, which might cause variation in electric characteristics of the transistor 122, can be suppressed.

Figure 4A:
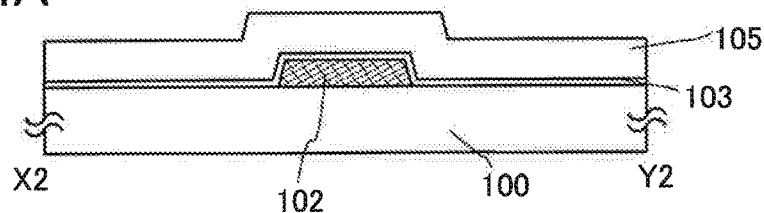
FIGS. 4A to 4E illustrate an example of a method for manufacturing a semiconductor device.

Next, an insulating layer 105 is formed over the insulating layer 103 (see FIG. 4A). The insulating layer 105 is affected by a shape of the conductive layer 102 and accordingly has a surface with a projection.

The insulating layer 105 can be formed by a CVD method, a sputtering method, or the like using silicon oxide, silicon oxynitride, aluminum oxide, aluminum oxynitride, hafnium oxide, gallium oxide, zinc gallium oxide, zinc oxide, or a mixed material thereof The insulating layer 105 may have a single layer or a stacked layer.

Next, planarization treatment is performed to remove the projection of an upper surface of the insulating layer 105, so that the insulating layer 104 is formed. There is no particular limitation on the planarization treatment; polishing treatment (such as chemical mechanical polishing), dry etching treatment, plasma treatment, or the like can be used. Further, such treatments may be performed in combination. By this planarization treatment, part of the insulating layer 103 (a region overlapping with the conductive layer 102) is exposed.

In order to reduce impurities such as hydrogen (including water, a hydroxyl group, and the like) in the insulating layer 104, heat treatment may be performed on the insulating layer 104 (or the insulating layer 105 that has not been subjected to planarization treatment) to remove hydrogen or a hydrogen compound (dehydration or dehydrogenation).

Figure 4B:
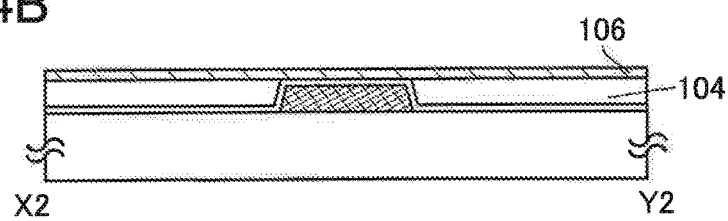
Figure 4C:
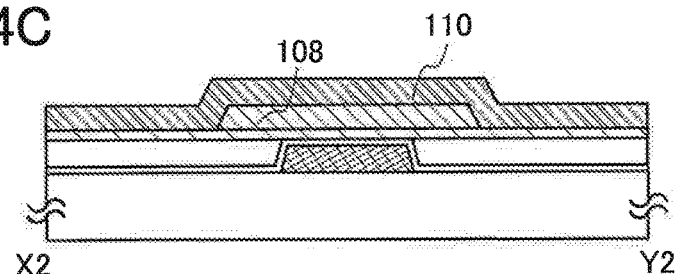

Next, the oxide insulating layer 106 is formed over the insulating layer 104 and the exposed insulating layer 103 by a CVD method such as a metal organic chemical vapor deposition method (MOCVD) or a sputtering method (see FIG. 4B).

The oxide insulating layer 106 is preferably an oxide insulating layer containing at least one of metal elements selected from constituent elements of an oxide semiconductor layer formed in a later step. For example, the following insulating films are preferably used: a gallium oxide film, a gallium zinc oxide film, a gallium gadolinium oxide film, an insulating In—Ga—Zn-based oxide film in which the gallium content is high and the indium content is low, and the like.

Note that in order to reduce the impurity contained in a film that is to be formed, the oxide insulating layer 106 is preferably formed by a MOCVD method through which particles are less generated than in the case of a sputtering method. For example, in the case where a gallium oxide film is formed as the oxide insulating layer 106 by a MOCVD method, trimethylgallium or the like can be used as a material.

Further, it is preferable that impurities such as hydrogen be reduced in the oxide insulating layer 106, and heat treatment for removing hydrogen or a hydrogen compound (dehydration or dehydrogenation) may be performed. This heat treatment can also serve as dehydration or dehydrogenation of the insulating layer 104.

Further, the oxide insulating layer 106 preferably includes an oxygen excess region because it is a layer in contact with the oxide semiconductor layer 108 formed in a later step. In order to provide the oxygen excess region in the oxide insulating layer 106, for example, the oxide insulating layer 106 may be formed in an oxygen atmosphere. Alternatively, oxygen may be introduced into the oxide insulating layer 106 after film deposition, whereby an oxygen excess region is formed in the oxide insulating layer 106.

In this embodiment, oxygen (at least including any of oxygen radicals, oxygen atoms, and oxygen ions) is introduced into the oxide insulating layer 106, whereby an oxygen excess region is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, dinitrogen monoxide, nitrogen dioxide, carbon dioxide, carbon monoxide, and the like can be used. Further, a rare gas may be contained in the gas containing oxygen in the oxygen introducing treatment.

Depending on conditions of oxygen introducing treatment, oxygen can be introduced not only to a layer directly exposed to oxygen but also to a layer provided below the layer. In other words, when oxygen is introduced to the oxide insulating layer 106, oxygen may be introduced to the insulating layer 104 and the insulating layer 103.

Next, an oxide semiconductor layer is formed over the oxide insulating layer 106, and it is processed into the island-shaped oxide semiconductor layer 108. Then, a conductive film 110 is formed to cover the oxide semiconductor layer 108 (see FIG. 4C).

The oxide semiconductor layer can be formed by a sputtering method, a molecular beam epitaxy (MBE) method, a CVD method, a pulse laser deposition method, an atomic layer deposition (ALD) method, or the like as appropriate.

In the formation of the oxide semiconductor layer, the hydrogen concentration in the oxide semiconductor layer is preferably reduced as much as possible. In order to reduce the hydrogen concentration, for example, in the case where the oxide semiconductor layer is formed by a sputtering method, a high-purity rare gas (typically argon), high-purity oxygen, or a high-purity mixed gas of a rare gas and oxygen, from which impurities such as hydrogen, water, a hydroxyl group, and a hydride have been removed, is used as appropriate as an atmosphere gas supplied to a deposition chamber of a sputtering apparatus.

The oxide semiconductor layer is formed in such a manner that a sputtering gas from which hydrogen and moisture are removed is introduced into the deposition chamber while moisture remaining in the deposition chamber is removed, whereby the concentration of hydrogen in the oxide semiconductor layer can be reduced. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. The cryopump has a high capability in removing a hydrogen molecule, a compound containing a hydrogen atom such as water ($H_2O$) (preferably, also a compound containing a carbon atom), and the like; thus, the impurity concentration in the oxide semiconductor layer formed in the deposition chamber which is evacuated with the cryopump can be reduced.

Further, when the oxide semiconductor layer is deposited by a sputtering method, the relative density (filling rate) of a metal oxide target that is used for the deposition is greater than or equal to 90% and less than or equal to 100%, preferably greater than or equal to 95% and less than or equal to 99.9%. With use of a metal oxide target with a high relative density, a dense oxide semiconductor layer can be deposited.

Further, for reducing the impurity concentration in the oxide semiconductor layer, it is also effective to form the oxide semiconductor layer while the substrate 100 is kept at high temperature. The temperature at which the substrate 100 is heated may be higher than or equal to 150° C. and lower than or equal to 450° C.; the substrate temperature is preferably higher than or equal to 200° C. and lower than or equal to 350° C. A crystalline oxide semiconductor layer can be formed by heating the substrate at a high temperature in the formation.

In the case where a CAAC-OS film is employed as the oxide semiconductor layer 108, the following methods can be used for forming the CAAC-OS film, for example One of the methods is to form an oxide semiconductor film at a film formation temperature higher than or equal to 200° C. and lower than or equal to 450° C., thereby obtaining c-axis alignment substantially perpendicular to a surface. Another method is to form a thin oxide semiconductor film and then subject the film to heat treatment performed at a temperature higher than or equal to 200° C. and lower than or equal to 700° C., thereby obtaining c-axis alignment substantially perpendicular to a surface. The other method is to form a first thin oxide semiconductor film, heat treatment is performed on the film at a temperature higher than or equal to 200° C. and lower than or equal to 700° C., and then form a second oxide semiconductor film, thereby obtaining c-axis alignment substantially perpendicular to a surface.

An oxide semiconductor used for the oxide semiconductor layer 108 contains at least indium (In). In particular, indium and zinc (Zn) are preferably contained. In addition, as a stabilizer for reducing a variation in electric characteristics of a transistor using the oxide semiconductor, the oxide semiconductor preferably gallium (Ga) in addition to In and Zn. It is preferable that one or more elements selected from tin (Sn), hafnium (Hf), aluminum (Al), and zirconium (Zr) be contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: a single-component metal oxide such as indium oxide, tin oxide, or zinc oxide; a two-component metal oxide such as an In—Zn-based oxide, an In—Mg-based oxide, or an In—Ga-based oxide; a three-component metal oxide such as an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In: Ga: Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is a natural number) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above atomic ratios may be used.

However, an oxide semiconductor containing indium that is included in a transistor is not limited to the materials given above; a material with an appropriate composition may be used for a transistor including an oxide semiconductor containing indium depending on needed electric characteristics (e.g., field-effect mobility, threshold voltage, and variation). In order to obtain the needed electric characteristics, the carrier concentration, the impurity concentration, the defect density, the atomic ratio between a metal element and oxygen, the interatomic distance, the density, and the like are preferably set to appropriate values.

For example, high field-effect mobility can be obtained relatively easily in a transistor including an In—Sn—Zn-based oxide. Also in the case of a transistor including an In—Ga—Zn-based oxide, the field-effect mobility can be increased by reducing the defect density in a bulk.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

Further, the oxide semiconductor layer 108 is preferably subjected to heat treatment for removing excess hydrogen, including water and a hydroxyl group, (dehydration or dehydrogenation) contained in the oxide semiconductor layer 108. The temperature of the heat treatment is higher than or equal to 300° C. and lower than or equal to 700° C., or lower than the strain point of the substrate. The heat treatment can be performed under reduced pressure, a nitrogen atmosphere, or the like. Hydrogen, which is an impurity imparting n-type conductivity, can be removed from the oxide semiconductor by the heat treatment.

Note that the heat treatment for dehydration or dehydrogenation may be performed at any timing in the process of manufacturing the transistor 122 as long as the heat treatment is performed after the formation of the oxide semiconductor layer. The heat treatment for dehydration or dehydrogenation may be performed plural times, and may also serve as another heat treatment.

Note that the heat treatment for dehydration or dehydrogenation is preferably performed before the oxide semiconductor layer is processed into an island shape because oxygen contained in the oxide insulating layer 106 can be prevented from being released by the heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999□%) or higher, further preferably 7N (99.99999□%) or higher (that is, the impurity concentration is preferably 1 ppm or lower, further preferably 0.1 ppm or lower).

In addition, after the oxide semiconductor layer 108 is heated in the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that has been reduced by the step of removing an impurity for the dehydration or dehydrogenation, so that the oxide semiconductor layer can have high purity and be an i-type (intrinsic) oxide semiconductor layer.

Since there is a possibility that oxygen, which is a main component of an oxide semiconductor, is also released and reduced by dehydration or dehydrogenation treatment, oxygen (including at least one of oxygen radicals, oxygen atoms, and oxygen ions) may be introduced to the oxide semiconductor layer which has been subjected to the dehydration or dehydrogenation treatment to supply oxygen to the layer.

Introduction (supply) of oxygen into the dehydrated or dehydrogenated oxide semiconductor layer enables the oxide semiconductor layer to be highly purified and to be i-type (intrinsic). Variation in electric characteristics of a transistor having the highly purified and i-type (intrinsic) oxide semiconductor is suppressed, and the transistor is electrically stable.

In the case where oxygen is introduced into the oxide semiconductor layer 108, oxygen may be directly introduced into the oxide semiconductor layer 108 or may be introduced into the oxide semiconductor layer 108 through an insulating layer formed in a later step. When oxygen is introduced through another film, an ion implantation method, an ion doping method, a plasma immersion ion implantation method, or the like may be used. In the case where oxygen is directly introduced into the exposed oxide semiconductor layer, plasma treatment or the like can be used in addition to the above-described methods.

For example, in the case where an oxygen ion is introduced into the oxide semiconductor layer 108 by an ion implantation method, the dose can be greater than or equal to $1\times10^{13}$ ions/cm$^2$ and less than or equal to $5\times10^{16}$ ions/cm$^2$.

Alternatively, oxygen may be supplied to the oxide semiconductor layer in the following manner: an insulating layer in contact with the oxide semiconductor layer (the oxide insulating layer 106 or the gate insulating layer 114) is formed to have an oxygen excess region; and heat treatment is performed in a state where the insulating layer and the oxide semiconductor layer are in contact with each other, so that excess oxygen contained in the insulating layer is diffused to the oxide semiconductor layer. This heat treatment can serve as another heat treatment in the process for manufacturing the transistor 122.

The supply of oxygen to the oxide semiconductor layer can be performed anytime after the formation of the oxide semiconductor layer. The step of introducing oxygen into the oxide semiconductor layer may be performed plural times.

The oxide insulating layer 106 and the oxide semiconductor layer 108 are preferably formed in succession without being exposed to the air. By successive formation of the oxide insulating layer 106 and the oxide semiconductor layer 108, impurities such as hydrogen and moisture can be prevented from being adsorbed onto a surface of the oxide insulating layer 106.

For example, a single layer of a metal film containing an element selected from Al, Cr, Cu, Ta, Ti, Mo, and W, or a metal nitride film containing any of these elements as a component (e.g., a titanium nitride film, a molybdenum nitride film, or a tungsten nitride film) can be used for the conductive film 110. Since the conductive film 110 has a single-layer structure, the productivity thereof can be high, and the manufacturing cost of a semiconductor device can be low. Alternatively, a conductive metal oxide can be used for the conductive film 110. As the conductive metal oxide, a single layer including indium oxide ($In_2O_3$ or the like), tin oxide ($SnO_2$ or the like), zinc oxide (ZnO or the like), indium oxide-tin oxide ($In_2O_3$—$SnO_2$ or the like), indium oxide-zinc oxide alloy ($In_2O_3$—ZnO or the like), or any of these metal oxide materials in which silicon oxide is contained can be used.

Further alternatively, as the conductive film 110, a single layer of a metal nitride film such as an In—Ga—Zn—O film containing nitrogen, an In—Sn—O film containing nitrogen, an In—Ga—O film containing nitrogen, an In—Zn—O film containing nitrogen, a Sn—O film containing nitrogen, or an In—O film containing nitrogen can be used. Such a film contains at least one of metal elements selected from the constituent elements of the oxide semiconductor layer 108; thus, an interface with the oxide semiconductor layer 108 can be stabilized.

Figure 4D:
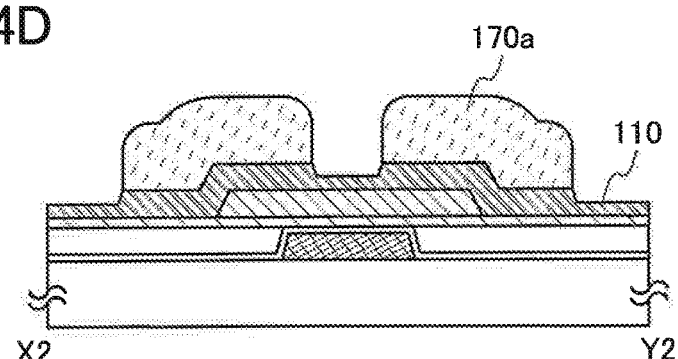
Figure 4E:
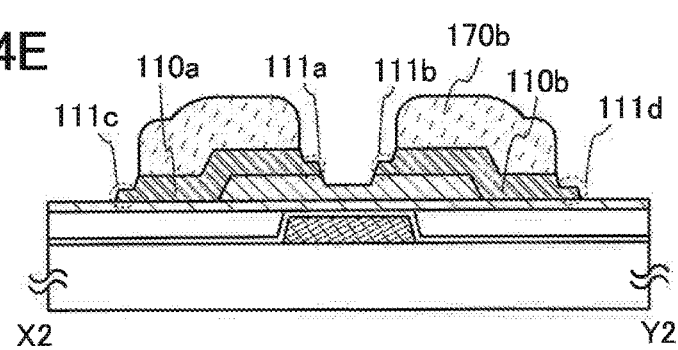

Next, a resist mask 170a is formed over the conductive film 110, and the conductive film 110 is subjected to half etching with use of the mask (etching is stopped so that the conductive film 110 is left to cover the oxide semiconductor layer 108), so that the conductive film 110 has a recessed portion (see FIG. 4D).

Next, the resist mask 170a is reduced (downsized), whereby a resist mask 170b is formed. In order to reduce the resist mask in size, ashing using oxygen plasma, or the like, may be performed. Then, the conductive film 110 is etched with use of the resist mask 170b, the source electrode layer 110a and the drain electrode layer 110b are formed (see FIG. 4E). Further, part of the conductive film 110, which is not covered with the resist mask 170b, is etched, whereby the projecting regions 111a, 111b, 111c, and 111d with a small thickness are formed at the edges of the source electrode layer 110a and the drain electrode layer 110b. Note that the regions 111a, 111b, 111c, and 111d have substantially the same width and substantially the same thickness.

The etching with use of the resist mask 170a, reduction (downsize) in the resist mask 170a, and the etching with use of the resist mask 170b can be carried out successively in the same chamber. Although in this embodiment, treatment of reducing (downsizing) the resist mask 170a is performed once, one embodiment of the present invention is not limited thereto. The reduction (downsize) treatment may be performed more than once, so that a plurality of steps may be formed at each of the edges of the source electrode layer 110a and the drain electrode layer 110b.

Further, through this etching treatment, in some cases, part of the oxide semiconductor layer 108 is etched together, thereby forming a region with a small thickness between the source electrode layer 110a and the drain electrode layer 110b. Alternatively, after the source electrode layer 110a and the drain electrode layer 110b are formed, the exposed oxide semiconductor layer 108 may be subjected to etching treatment (e.g., wet etching treatment), whereby a region with a small thickness is provided.

Figure 5A:
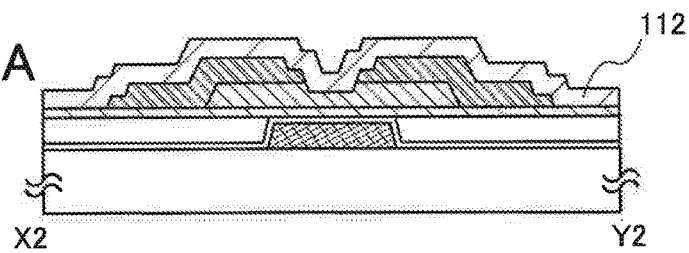
FIGS. 5A to 5E illustrate an example of a method for manufacturing a semiconductor device.

Next, the insulating layer 112 is formed to cover the source electrode layer 110a, the drain electrode layer 110b, and the exposed oxide semiconductor layer 108 (see FIG. 5A).

The insulating layer 112 is formed using a silicon oxide film, a silicon oxynitride film, an aluminum oxide film, an aluminum oxynitride film, a silicon nitride film, an aluminum nitride film, a silicon nitride oxide film, an aluminum nitride oxide film, or the like. Note that a material used for the insulating layer 112 is different from that used for the gate insulating layer 114 formed in a later step, and a difference of the etching rate between the material of the insulating layer 112 and that of the gate insulating layer 114 is preferably large.

Figure 5B:
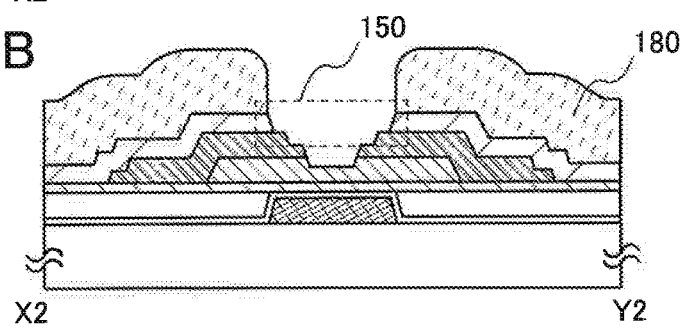

Next, a resist mask 180 is formed over the insulating layer 112, and the insulating layer 112 is etched with use of the mask, so that an opening 150 is formed (see FIG. 5B). Through this etching treatment, the oxide semiconductor layer 108, the source electrode layer 110a, and the drain electrode layer 110b are partly exposed.

Figure 5C:
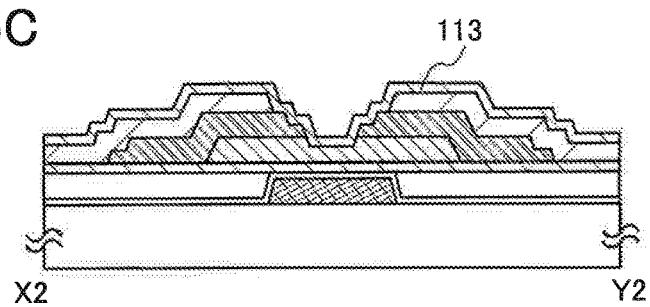

Next, a gate insulating film 113 is formed to cover the insulating layer 112, the exposed oxide semiconductor layer 108, the exposed source electrode layer 110a, and the exposed drain electrode layer 110b (see FIG. 5C). The gate insulating film 113 can be formed in a manner similar to that of the oxide insulating layer 106.

When the source electrode layer 110a and the drain electrode layer 110b have projecting regions with a small thickness at the edges, the thicknesses of the edges are gradually decreased, which can improve coverage with the gate insulating film 113 formed over the electrode layers. Thus, in the gate insulating film 113 (or the gate insulating layer 114), a small thickness region can be prevented from being locally formed, and the electric field concentration between the source electrode layer 110a and the drain electrode layer 110b can be relaxed. In addition, disconnection or poor connection can be suppressed.

Figure 5D:
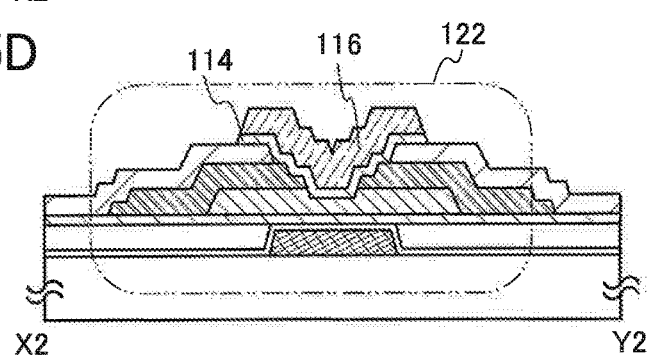

After that, a conductive layer that is to be a gate electrode layer (including a wiring formed using the same layer as the gate electrode layer) is formed over the gate insulating film 113 and selective etching is performed to form the gate insulating layer 114 and the gate electrode layer 116 (see FIG. 5D). Note that in this etching treatment, the insulating layer 112 functions as a protective layer of the source electrode layer 110a and the drain electrode layer 110b.

The gate electrode layer 116 can be formed using a material and method similar to those of the conductive layer 102. For the gate electrode layer 116, at least on the side of a surface in contact with the gate insulating layer 114, a material with a higher work function than the oxide semiconductor layer 108 is preferably used. It is further preferable to use a material with a higher work function by 1 eV or higher than the oxide semiconductor layer 108.

Through the above steps, the transistor 122 in this embodiment can be manufactured.

Figure 5E:
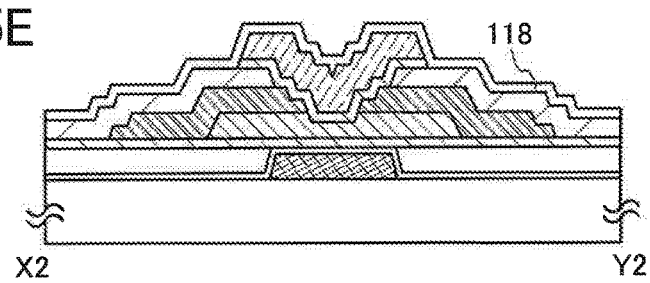

Note that the insulating layer 118 may be formed over the gate electrode layer 116 (see FIG. 5E). The insulating layer 118 can be formed using a material and method similar to those of the insulating layer 103. Note that it is preferable that the insulating layer 118 function as a barrier layer (protective layer) which prevents oxygen from being released from the oxide semiconductor layer 108 or the insulating layer in contact with the oxide semiconductor layer 108.

In the transistor described in this embodiment, regions projecting in the channel length direction are provided at lower end portions of the source electrode layer and the drain electrode layer so that the channel formation region in the oxide semiconductor layer is sandwiched therebetween. With such a structure, coverage with the gate insulating layer provided in contact with the electrode layers can be improved. Thus, a thin region is not locally formed in the gate insulating layer, and damage on the transistor due to concentration of an electric field on the thin region can be prevented.

Further, in addition to the gate insulating layer, another insulating layer is provided between the gate electrode layer and the source and drain electrode layers. With such a structure, parasitic capacitance generated between the gate electrode layer and the source and drain electrode layers can be reduced.

Therefore, the transistor described in this embodiment can be a miniaturized transistor having excellent electric characteristics.

The structures, methods, and the like described in this embodiment can be combined as appropriate with any of the other structures, methods, and the like described in the other embodiments.

(Embodiment 2)

In this embodiment, an example of a semiconductor device which includes the transistor described in Embodiment 1, which can hold stored data even when not powered, and which does not have a limitation on the number of write cycles, will be described with reference to drawings.

Figure 6A:
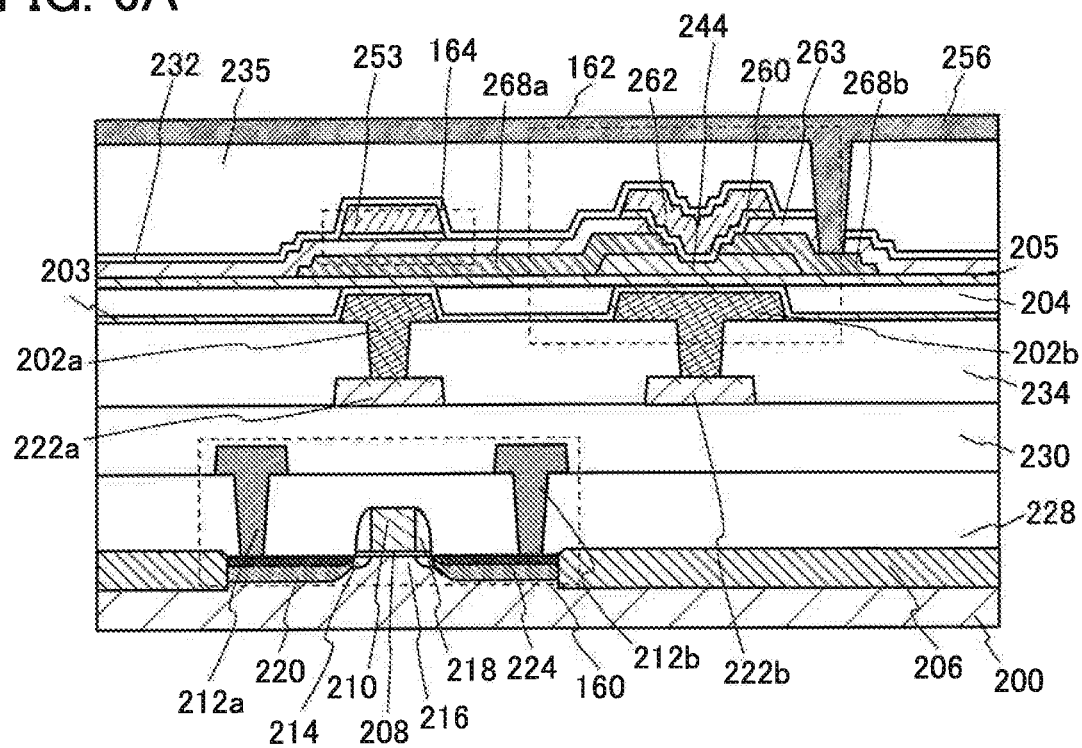
FIGS. 6A and 6B are a cross-sectional view and a circuit diagram illustrating one embodiment of a semiconductor device.
Figure 6B:
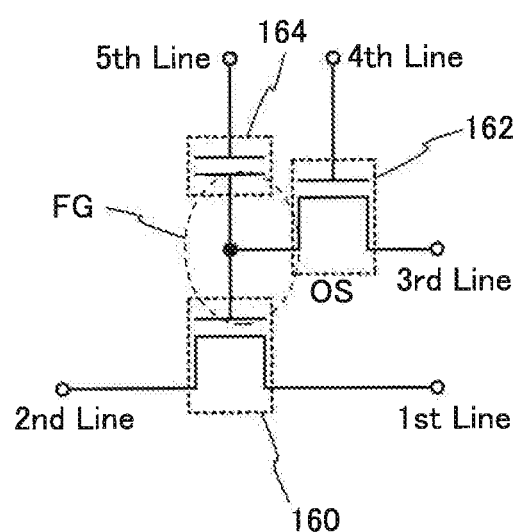

FIGS. 6A and 6B illustrate one example of a structure of the semiconductor device. FIG. 6A is a cross-sectional view of the semiconductor device, and FIG. 6B is a circuit diagram of the semiconductor device.

The semiconductor device illustrated in FIG. 6A includes a transistor 160 including a first semiconductor material in a lower portion, and a transistor 162 including a second semiconductor material in an upper portion. The transistor which is one embodiment of the present invention described in Embodiment 1 can be employed as the transistor 162. In this embodiment, a transistor having a structure similar to that of the transistor 122 is used.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can be used. The specific structure of the semiconductor device, such as the material used for the semiconductor device and the structure of the semiconductor device, is not necessarily limited to those described here except for the use of the transistor described in Embodiment 1, which is formed using an oxide semiconductor, as the transistor 162 for holding data.

The transistor 160 illustrated in FIG. 6A includes a channel formation region 216 provided in a substrate 200 including a semiconductor material (e.g., silicon), impurity regions 214 and high-concentration impurity regions 220 (these are simply collectively referred to as impurity regions) which are provided so that the channel formation region 216 is sandwiched therebetween, intermetallic compound regions 224 in contact with the high-concentration impurity regions 220, a gate insulating layer 208 provided over the channel formation region 216, a gate electrode layer 210 provided over the gate insulating layer 208, sidewall insulating layers 218 provided on side surfaces of the gate electrode layer 210, an electrode layer 212a, and an electrode layer 212b.

The electrode layer 212a and the electrode layer 212b are electrode layers functioning as a source electrode layer and a drain electrode layer and are electrically connected to the intermetallic compound regions 224 through contact holes provided in the insulating layer 228 that is formed over the gate electrode layer 210. The insulating layer 228 may have a single-layer structure or a stacked structure including an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film An element isolation insulating layer 206 is provided over the substrate 200 to surround the transistor 160.

The transistor 160 formed using a single crystal semiconductor substrate can operate at high speed. Thus, when the transistor is used as a reading transistor, data can be read at a high speed.

The transistor 162 illustrated in FIG. 6A includes an oxide semiconductor in a channel formation region. The transistor including an oxide semiconductor in a channel formation region can achieve extremely low off-state current. Note that an oxide semiconductor layer included in the transistor 162 is preferably highly purified. By using a highly purified oxide semiconductor, the transistor 162 can have extremely favorable off-state characteristics.

Since the amount of off-state current of the transistor 162 is small, stored data can be held for a long time. In other words, power consumption can be sufficiently reduced because a semiconductor device in which refresh operation is unnecessary or the frequency of refresh operation is extremely low can be provided.

In the transistor 162, an electrode layer 268a and an electrode layer 268b which are provided so that a channel formation region in an oxide semiconductor layer 244 is sandwiched therebetween have regions projecting in the channel length direction at the lower end portions, and an insulating layer 263 is provided, in addition to a gate insulating layer 260, between the electrode layers and a gate electrode layer 262. With such a structure of the transistor 162 that the electrode layer 268a and the electrode layer 268b have the regions projecting in the channel length direction at the lower end portions, the concentration of electric field can be relaxed. Further, with the insulating layer 263, parasitic capacitance generated between the gate electrode layer 262 and the electrode layers 268a and 268b can be reduced. In addition to the gate electrode layer 262 overlapping with the oxide semiconductor layer 244 with the gate insulating layer 260 interposed therebetween, the transistor 162 includes a conductive layer 202b overlapping with the oxide semiconductor layer 244 with an insulating layer 203, an insulating layer 204, and an insulating layer 205 interposed therebetween. The conductive layer 202b can be used as a so-called back gate. When a negative bias voltage is applied to the conductive layer 202b, the threshold voltage of the transistor 162 can be shifted in the positive direction.

Each of the insulating layer 203 and the insulating layer 204 can be formed using a film of silicon oxide, silicon oxynitride, aluminum oxide, aluminum oxynitride, hafnium oxide, gallium oxide, zinc gallium oxide, or a mixed material of these materials. As the insulating layer 205, an oxide insulating layer containing at least one of metal elements selected from constituent elements of the oxide semiconductor layer 244 is preferably used. Further, the insulating layer 205 preferably includes an oxygen excess region.

Note that it is preferable to use a film having barrier properties against oxygen, as the insulating layer 203 because the barrier film can prevent a release of oxygen from the insulating layer 205.

Further, the conductive layer 202b and an electrode layer 202a preferably have a tapered shape to improve coverage with the insulating layer 203. Here, the taper angle is preferably greater than or equal to 30° and less than or equal to 70°.

Over the transistor 162, an insulating layer 232 and an insulating layer 235 each of which has a single-layer structure or a stacked structure are provided. The insulating layer 232 or the insulating layer 235 can be formed using a film containing a material similar to that of the insulating layer 203 and the insulating layer 204. Note that after the insulating layer 235 is formed, planarization treatment such as CMP treatment is performed to planarize a surface of the insulating layer 235, as needed. Alternatively, a planarization insulating film may be formed as the insulating layer 235 to reduce surface unevenness due to the transistor, or an inorganic insulating film and the planarization insulating film may be stacked. As the planarization insulating film, an organic material such as a polyimide-based resin, an acrylic-based resin, or a benzocyclobutene-based resin can be used. Besides the above organic materials, a low-dielectric constant material (a low-k material) or the like can be used.

Over the insulating layer 235, a wiring layer 256 is provided to connect the transistor 162 to another transistor. The wiring layer 256 is electrically connected to the electrode layer 268b through a contact hole formed in the insulating layer 235, the insulating layer 232, the gate insulating layer 260, and the like. Note that another electrode layer may be formed in the contact hole, and with the electrode layer, the wiring layer 256 and the electrode layer 268b may be electrically connected.

A conductive layer 253 is provided in a region overlapping with the electrode layer 268a of the transistor 162 with the gate insulating layer 260 interposed therebetween, and the electrode layer 268a, the gate insulating layer 260, and the conductive layer 253 form a capacitor 164. That is, the electrode layer 268a of the transistor 162 functions as one electrode of the capacitor 164, and the conductive layer 253 functions as the other electrode of the capacitor 164. Note that the capacitor 164 may be omitted if a capacitor is not needed. Alternatively, the capacitor 164 may be separately provided above the transistor 162.

In this embodiment, the conductive layer 253 can be formed in the same manufacturing step as the gate electrode layer 262 of the transistor 162.

The electrode layer 268a is electrically connected to the electrode layer 202a formed in the same layer as the conductive layer 202b. The electrode layer 202a is electrically connected to an electrode layer 222a through a contact hole formed in an insulating layer 234. Although not illustrated in FIG. 6A, the electrode layer 222a is electrically connected to the gate electrode layer 210 of the transistor 160. Thus, the electrode layer 268a of the transistor 162 is electrically connected to the gate electrode layer 210 of the transistor 160.

Each of an insulating layer 230 and the insulating layer 234 can have a structure similar to that of the insulating layer 228. Note that the insulating layer 228, the insulating layer 230, and the insulating layer 234 may be subjected to planarization treatment if necessary. Electrical connection between the electrode layer 268a of the transistor 162 and the gate electrode layer 210 of the transistor 160 is not limited to the structure in FIG. 6A, and the structure regarding intervening electrode layers (or wiring layers) or insulating layers can be determined as appropriate. For example, an electrode layer may be additionally provided between the electrode layer 202a and the electrode layer 222a, or the electrode layer 268a may be directly connected to the gate electrode layer 210.

In FIG. 6A, the electrode layer 202a is electrically connected to the electrode layer 268a through the contact hole formed in the insulating layer 204. In addition, the conductive layer 202b of the transistor 162 is electrically connected to a wiring layer 222b provided in the same layer as the electrode layer 222a.

In FIG. 6A, the transistor 160 and the transistor 162 are provided to overlap with each other at least partly. Further, the transistor 162 and the capacitor 164 are preferably provided so as to overlap with at least part of the transistor 160. For example, the conductive layer 253 of the capacitor 164 is provided so as to overlap with the gate electrode layer 210 of the transistor 160 at least partly. With such a planar layout, the area occupied by the semiconductor device can be reduced; thus, higher integration can be achieved.

Next, an example of a circuit configuration corresponding to FIG. 6A is illustrated in FIG. 6B.

In FIG. 6B, a first wiring (1st Line) is electrically connected to a source electrode layer of the transistor 160, and a second wiring (2nd Line) is electrically connected to a drain electrode layer of the transistor 160. A third wiring (3rd Line) is electrically connected to one of the source electrode layer and the drain electrode layer of the transistor 162, and a fourth wiring (4th Line) is electrically connected to a gate electrode layer of the transistor 162. A gate electrode layer of the transistor 160 and the other of the source electrode layer and the drain electrode layer of the transistor 162 are electrically connected to one electrode of the capacitor 164. A fifth wiring (5th Line) is electrically connected to the other electrode of the capacitor 164.

The semiconductor device illustrated in FIG. 6B utilizes a characteristic in which the potential of the gate electrode layer of the transistor 160 can be held, and thus enables data writing, holding, and reading as follows.

Writing and holding of data will be described. First, the potential of the fourth wiring is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, charge for supply of a potential level or charge for supply of a different potential level (hereinafter referred to as low-level charge and high-level charge) is given. After that, the potential of the fourth wiring is set to a potential at which the transistor 162 is turned off, so that the transistor 162 is turned off. Thus, the charge given to the gate electrode layer of the transistor 160 is held (holding).

Since the off-state current of the transistor 162 is extremely low, the charge of the gate electrode layer of the transistor 160 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode layer of the transistor 160. This is because in general, when the transistor 160 is an n-channel transistor, an apparent threshold voltage $V_{th\_H}$ in the case where the high-level charge is given to the gate electrode layer of the transistor 160 is lower than an apparent threshold voltage $V_{th\_L}$ in the case where the low-level charge is given to the gate electrode layer of the transistor 160. Here, an apparent threshold voltage refers to the potential of the fifth line, which is needed to turn on the transistor 160. Thus, the potential of the fifth wiring is set to a potential $V_0$ which is between $V_{th\_H}$ and $V_{th\_L}$, whereby charge given to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the memory cell where data is not read, a potential at which the transistor 160 is turned off regardless of the state of the gate electrode layer of the transistor 160, that is, a potential smaller than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth wiring.

When a transistor having a channel formation region formed using an oxide semiconductor and having extremely low off-state current is employed for the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed). Further, when a normally-off transistor is used as the transistor 162, and power is not supplied, a ground potential may be input to the gate (the gate electrode layer 262) of the transistor 162. With that structure, the transistor 162 can remain off and stored data can keep being held even when power is not supplied.

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to the disclosed invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electric characteristics and a method for manufacturing the semiconductor device can be provided.

The methods and structures described in this embodiment can be combined as appropriate with any of the methods and structures described in the other embodiments.

(Embodiment 3)

In this embodiment, a semiconductor device which includes any of the transistors described in Embodiment 1, which can hold stored data even when not powered, and which does not have a limitation on the number of write cycles, and which has a structure different from the structure described in Embodiment 2 will be described with reference to FIGS. 7A and 7B.

Figure 7A:
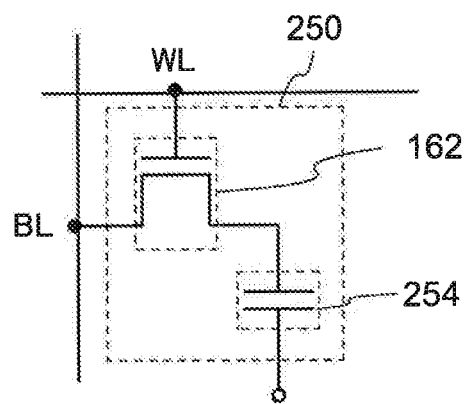
FIGS. 7A and 7B are a circuit diagram and a perspective view illustrating one embodiment of a semiconductor device.
Figure 7B:
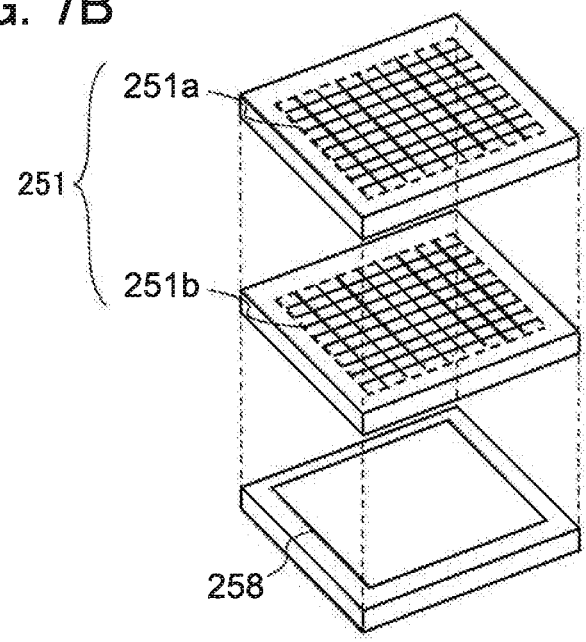

FIG. 7A illustrates an example of a circuit configuration of a semiconductor device, and FIG. 7B is a conceptual diagram illustrating an example of a semiconductor device.

First, the semiconductor device illustrated in FIG. 7A will be described, and then, the semiconductor device illustrated in FIG. 7B will be described.

In the semiconductor device illustrated in FIG. 7A, a bit line BL is electrically connected to the source electrode layer or the drain electrode layer of the transistor 162, a word line WL is electrically connected to the gate electrode layer of the transistor 162, and the source electrode layer or the drain electrode layer of the transistor 162 is electrically connected to a first terminal of a capacitor 254.

Next, writing and holding of data in the semiconductor device (a memory cell 250) illustrated in FIG. 7A will be described.

First, the potential of the word line WL is set to a potential at which the transistor 162 is turned on, and the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential at the first terminal of the capacitor 254 is held (holding).

Moreover, the transistor 162 including an oxide semiconductor has extremely low off-state current. For that reason, a potential of the first terminal of the capacitor 254 (or a charge accumulated in the capacitor 254) can be held for an extremely long period by turning off the transistor 162. Further, when a normally-off transistor is used as the transistor 162, and power is not supplied, a ground potential may be input to the gate of the transistor 162. With that structure, the transistor 162 can remain off and stored data can be kept on being held even when power is not supplied.

Next, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is represented by $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0 (=(C_B \times V_{B0} + C \times V_0)/(C_B + C))$.

Then, by comparing the potential of the bit line BL with a predetermined potential, data can be read.

As described above, the semiconductor device illustrated in FIG. 7A can hold charge that is accumulated in the capacitor 254 for a long time because the amount of the off-state current of the transistor 162 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 7B will be described.

The semiconductor device illustrated in FIG. 7B includes memory cell arrays 251a and 251b including a plurality of memory cells 250 illustrated in FIG. 7A as memory circuits in an upper portion, and a peripheral circuit 258 in a lower portion which is necessary for operating a memory cell array 251 (the memory cell arrays 251a and 251b). Note that the peripheral circuit 258 is electrically connected to the memory cell array 251.

In the structure illustrated in FIG. 7B, the peripheral circuit 258 can be provided directly under the memory cell array 251 (the memory cell arrays 251a and 251b). Thus, the size of the semiconductor device can be reduced.

It is preferable that a semiconductor material of the transistor provided in the peripheral circuit 258 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 7B illustrates, as an example, the semiconductor device in which two memory cell arrays 251 (the memory cell arrays 251a and 251b) are stacked; however, the number of memory cell arrays to be stacked is not limited thereto. Three or more memory cell arrays may be stacked.

As described above, a miniaturized and highly-integrated semiconductor device having high electric characteristics and a method for manufacturing the semiconductor device can be provided.

This embodiment can be implemented in appropriate combination with the structures described in the other embodiments.

(Embodiment 4)

Figure 8A:
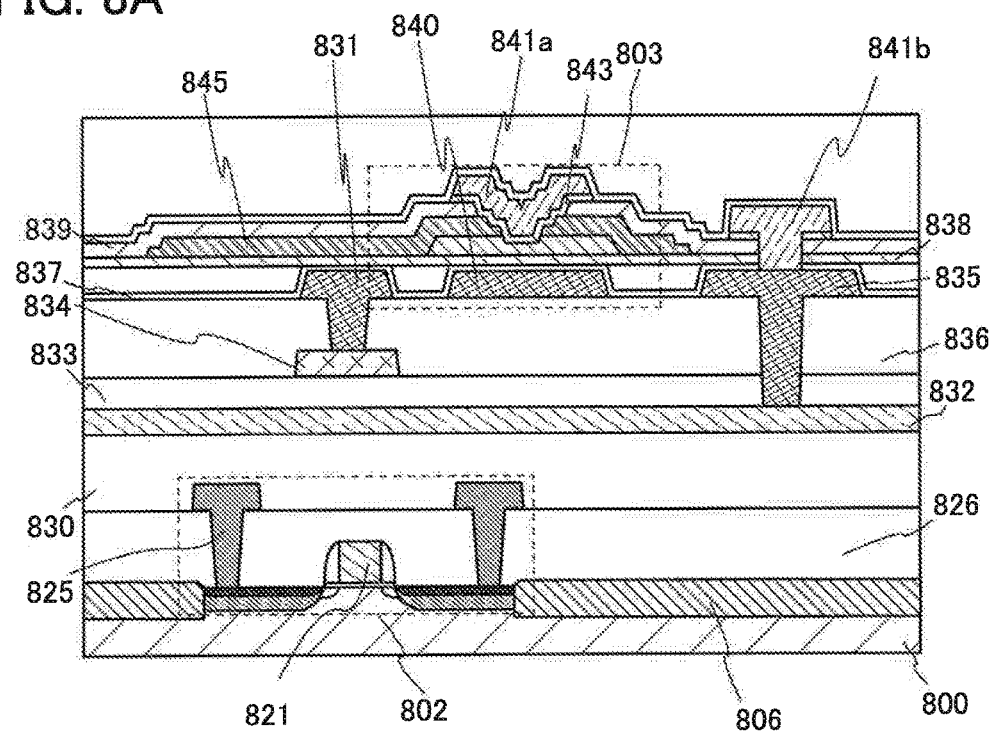
FIGS. 8A to 8C are a cross-sectional view and circuit diagrams illustrating one embodiment of a semiconductor device.
Figure 8B:
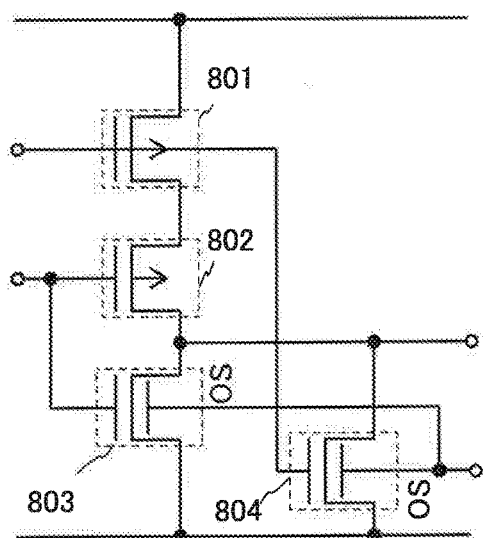
Figure 8C:
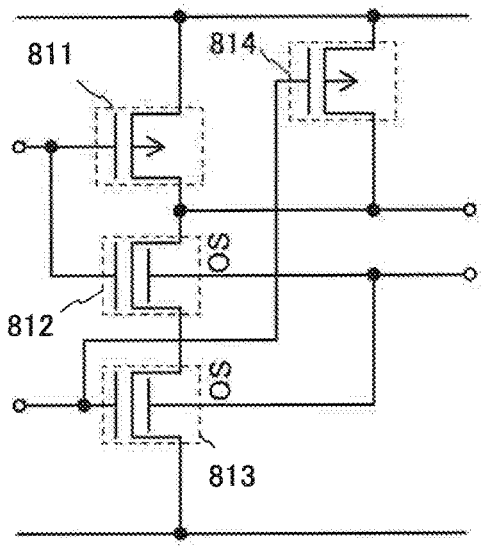

In this embodiment, as other examples of the semiconductor device that uses the transistor described in this specification, a NOR circuit and a NAND circuit, which are logic circuits, are illustrated in FIGS. 8A to 8C. FIG. 8B shows the NOR circuit, and FIG. 8C shows the NAND circuit. FIG. 8A is a cross-sectional view illustrating structures of a transistor 802 and a transistor 803 in the NOR circuit in FIG. 8B.

In the NOR circuit and the NAND circuit illustrated in FIGS. 8B and 8C, p-channel transistors 801, 802, 811, and 814 can have the same structure as the transistor 160 described in Embodiment 2. In this embodiment, boron (B), aluminum (Al), gallium (Ga), or the like which is an impurity element imparting p-type conductivity is introduced into a substrate 800 that uses an n-type semiconductor material (e.g., n-type single crystal silicon substrate), so that the p-channel transistors including p-type impurity regions are formed.

Further, for n-channel transistors 803, 804, 812, and 813, a transistor which has a structure similar to that of any of the transistors described in Embodiment 1, where an oxide semiconductor film is used for a channel formation region, is employed.

In the NOR circuit and the NAND circuit illustrated in FIGS. 8A to 8C, the transistors 803, 804, 812, and 813 each have regions projecting in the channel length direction at lower end portions of a source electrode layer and a drain electrode layer between which the channel formation region in the oxide semiconductor layer is sandwiched. Thus, the electric field concentration between the electrode layers can be relaxed. In addition, an insulating layer may be provided between a gate electrode layer and the source and drain electrode layers in addition to a gate insulating layer. Thus, generation of parasitic capacitance between the electrode layers and the gate electrode layer can be reduced. Further, a first gate electrode layer and a second gate electrode layer are provided such that insulating layers are sandwiched therebetween, and further the oxide semiconductor layer is sandwiched between the insulating layers. One of the gate electrode layers is used as a back gate. By controlling the potential of the back gate as appropriate, for example, to be GND, the threshold voltages of the transistors 803, 804, 812, and 813 can be moved in the positive direction; consequently, the transistors can be normally-off.

In the example described in this embodiment, the gate electrode layers which are provided in the transistors 803 and the transistor 804 and each function as a back gate are electrically connected to each other in the NOR circuit, and the gate electrode layers which are provided in the transistor 812 and the transistor 813 and each function as a back gate are electrically connected to each other in the NAND circuit. However, without limitation to the above structure, a structure in which each of the gate electrode layers functioning as back gates is independently electrically controlled may be employed.

The semiconductor device illustrated in FIG. 8A is an example in which a single crystal silicon substrate is used as the substrate 800, the transistor 802 is formed using the single crystal silicon substrate, and the transistor 803 including a channel formation region formed using the oxide semiconductor layer is stacked over the transistor 802. Over the substrate 800, an element isolation insulating layer 806 is provided to surround the transistor 802.

An electrode layer 841b electrically connected to a gate electrode layer 841a of the transistor 803 is electrically connected to an electrode layer 835 that is an electrode layer provided in the same layer as a gate electrode layer 840 through a contact hole provided in a gate insulating layer 843, an insulating layer 839, an oxide insulating layer 838, and an insulating layer 837. The electrode layer 835 is electrically connected to a wiring layer 832 through a contact hole provided in an insulating layer 836 and an insulating layer 833. Although not clearly illustrated in FIG. 8A, the wiring layer 832 is electrically connected to a gate electrode layer 821 of the transistor 802 through a contact hole provided in an insulating layer 830 and an insulating layer 826. Accordingly, the gate electrode layer 841a of the transistor 803 is electrically connected to the gate electrode layer 821 of the transistor 802.

Furthermore, although not clearly illustrated in FIG. 8A, an electrode layer 825 of the transistor 802 is electrically connected to a wiring layer 834, and the wiring layer 834 is electrically connected to an electrode layer 845 of the transistor 803 with an electrode layer 831. Thus, the electrode layer 825 of the transistor 802 is electrically connected to the electrode layer 845 of the transistor 803.

Note that the structure enabling electrical connection between the electrode layer (or the gate electrode layer) of the transistor 802 and the electrode layer (or the gate electrode layer) of the transistor 803 is not limited to the structure illustrated in FIG. 8A, and the structure regarding intervening electrode layers (or wiring layers) or insulating layers can be determined as appropriate.

The overlapping structure of the transistor 802 and the transistor 803 illustrated in FIG. 8A can reduce the area of the semiconductor device, leading to higher integration.

Further, since the transistor 802 is a transistor that can be normally-off, the logic circuit can be controlled precisely.

As described above, a miniaturized and highly-integrated semiconductor device having high electric characteristics and a method for manufacturing the semiconductor device can be provided.

The methods and structures described in this embodiment can be combined as appropriate with any of the methods and structures described in the other embodiments.

(Embodiment 5)

In this embodiment, a central processing unit (CPU) at least part of which includes the transistor described in Embodiment 1 will be described as an example of a semiconductor device.

Figure 9A:
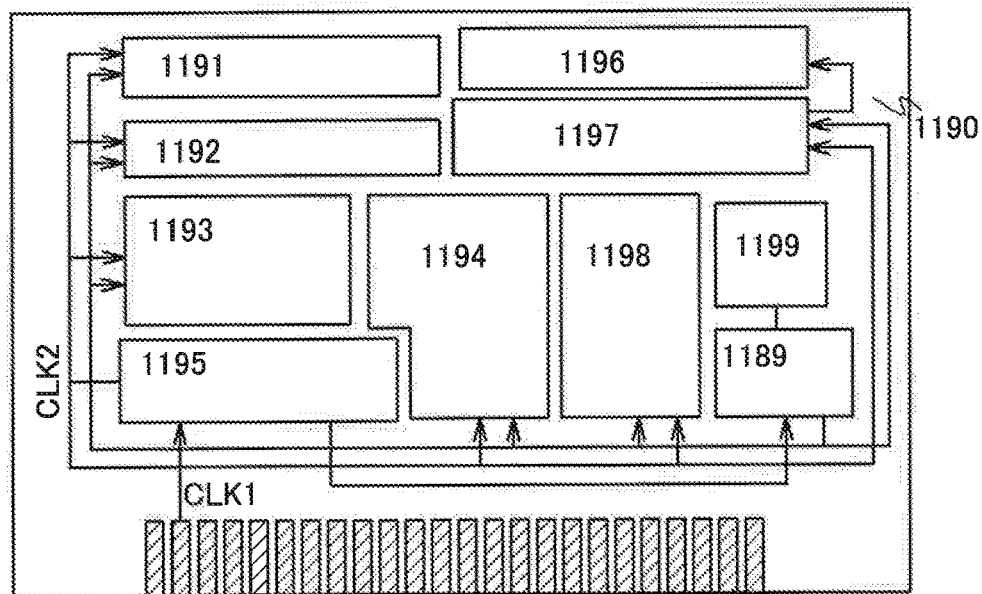
FIGS. 9A to 9C are a block diagram illustrating one embodiment of a semiconductor device and partial circuit diagrams of the block diagram.

FIG. 9A is a block diagram illustrating a specific structure of a CPU. The CPU illustrated in FIG. 9A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 9A is only an example in which the structure is simplified, and a variety of structures is applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 9A, a memory cell is provided in the register 1196. The memory cell described in Embodiment 2 or 3 can be used as the memory cell in the register 1196.

In the CPU illustrated in FIG. 9A, the register controller 1197 selects operation of holding data in the register 1196 in accordance with an instruction from the ALU 1191. That is, the register controller 1197 selects whether data is held by a logic element which inverts a logical value or a capacitor in the memory cell included in the register 1196. When data holding by the logic element which inverts a logical value is selected, power supply voltage is supplied to the memory cell in the register 1196. When data holding by the capacitor is selected, the data is rewritten in the capacitor, and supply of power supply voltage to the memory cell in the register 1196 can be stopped.

Figure 9B:
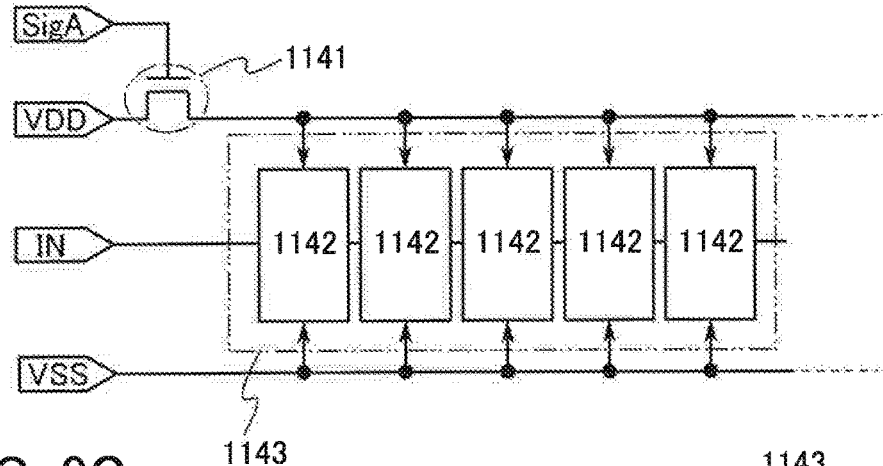
Figure 9C:
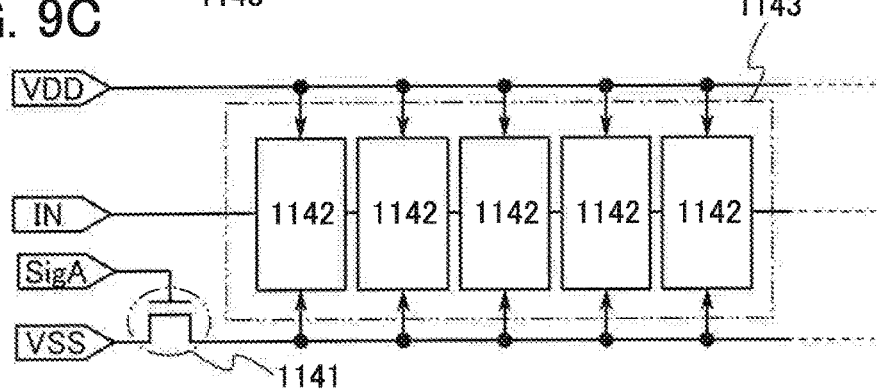

The power supply can be stopped by a switching element provided between a memory cell group and a node to which a power supply potential VDD or a power supply potential VSS is supplied, as illustrated in FIG. 9B or FIG. 9C. Circuits illustrated in FIGS. 9B and 9C are described below.

FIGS. 9B and 9C each illustrate an example of a structure of a memory circuit in which any of the transistors described in Embodiment 1 is used as a switching element for controlling supply of a power supply potential to a memory cell.

The memory device illustrated in FIG. 9B includes a switching element 1141 and a memory cell group 1143 including a plurality of memory cells 1142. Specifically, as each of the memory cells 1142, the memory cell described in Embodiment 2 or 3 can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 9B, any of the transistors described in Embodiment 1 is used as the switching element 1141, and the switching of the transistor is controlled by a signal Sig A supplied to a gate electrode layer thereof Note that FIG. 9B illustrates a configuration in which the switching element 1141 includes only one transistor; however, one embodiment of the present invention is not limited thereto. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 9B, the switching element 1141 may control the supply of the low-level power supply potential VSS.

FIG. 9C illustrates an example of a memory device in which each of the memory cells 1142 included in the memory cell group 1143 is supplied with the low-level power supply potential VSS via the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The methods and structures described in this embodiment can be combined as appropriate with any of the methods and structures described in the other embodiments.

Further, Table 1 shows a comparison between a spin-MRAM (spin-transfer torque MRAM) which is known as a spintronics device and a memory including an oxide semiconductor.

TABLE 1

|  | Spintronics (magnetic) | Oxide semiconductor/Si |
|---|---|---|
| 1) Heat resistance | Unstable | Extremely stable (up to 150° C.) |
| 2) Driving method | Current drive | Voltage drive |
| 3) Principle of writing operation | Change Spin Direction of Magnetic Substance | On/off of FET |
| 4) Si LSI | Suitable for bipolar LSI (MOS transistor is preferred in high integration circuit (Bipolar transistor is unsuitable for High Integration); W is large) | Suitable for MOS LSI |
| 5) Power for Overhead | High<br>Joule heat is needed | Charge and discharge of parasitic capacitance Smaller by 2 or 3 or more orders of magnitude |
| 6) Non-volatility | Utilizing Spin | Utilizing small off-state current |
| 7) Number of times of reading operation | Unlimited | Unlimited |
| 8) 3D conversion | Difficult (2 layers at most) | Easy (No limitation on the number of layers) |
| 9) Degree of integration ($F^2$) | $15F^2$ | Depending on the degree of 3D conversion |
| 10) Material | Rare earth magnetic material | Oxide semiconductor material |
| 11) Resistance to magnetic field | Low | High |

As shown in Table 1, the memory in which a transistor including an oxide semiconductor and a transistor including silicon are combined is significantly different from the spintronics device in the driving method, the principle of writing operation, the material, and the like.

Further, as shown in Table 1, the memory in which the transistor including an oxide semiconductor and the transistor including silicon are combined has advantages over the spintronics device in many aspects such as the heat resistance, the 3D conversion (stacked-layer structure of three or more layers), and the resistance to a magnetic field. Note that the "power for overhead" in Table 1 means a so-called power consumed by overhead, which is, for example, power for writing data into a memory portion or the like in a processor.

As described above, the use of the memory including an oxide semiconductor, which has more advantages than the spintronics device, makes it possible to reduce power consumption of a CPU.

The methods and structures described in this embodiment can be combined as appropriate with any of the methods and structures described in the other embodiments.

Embodiment 6

A semiconductor device disclosed in this specification can be applied to a variety of electronic devices (including game machines). Examples of the electronic devices include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 10A to 10C.

Figure 10A:
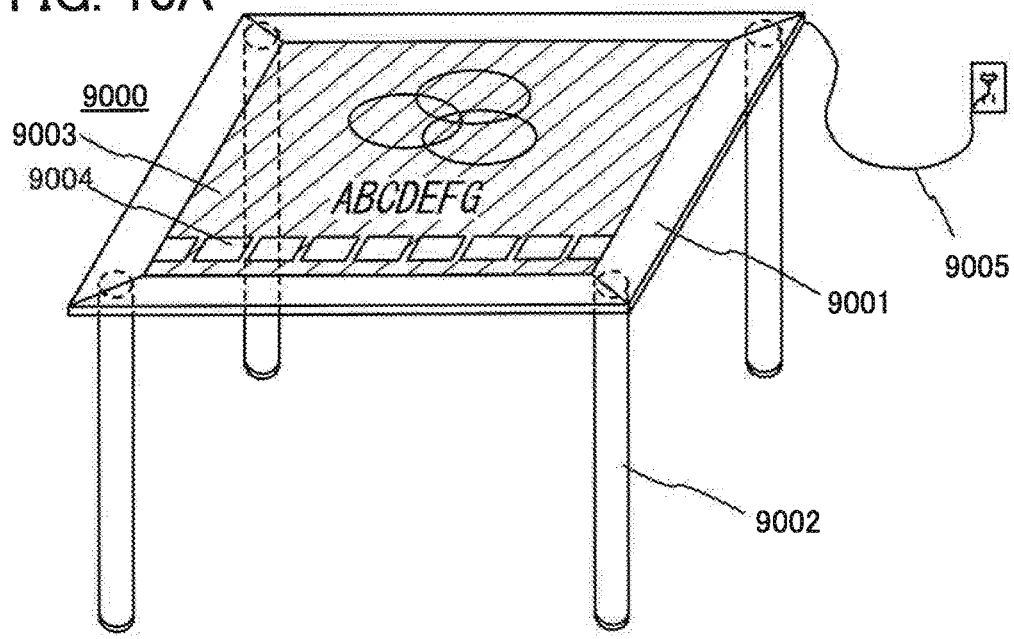
FIGS. 10A to 10C each illustrate an electronic device.
Figure 10B:
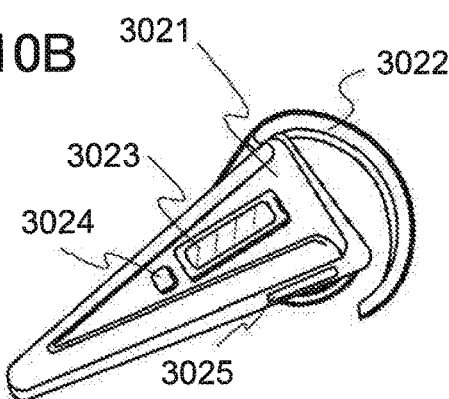
Figure 10C:
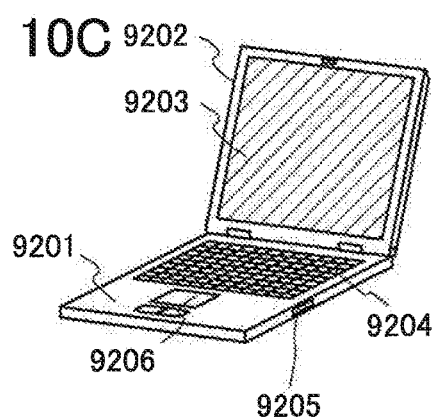

FIG. 10A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The transistor described in Embodiment 1 can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 10B illustrates a portable music player, which includes, in a main body 3021, a display portion 3023, a fixing portion 3022 with which the main body is worn on the ear, a speaker, an operation button 3024, an external memory slot 3025, and the like. The transistor described in any of Embodiment 1 or the memory or logic circuit described in any of Embodiments 2 to 4 is used in a memory or a CPU incorporated in the main body 3021, whereby a portable music player (PDA) in which power consumption can be further reduced can be provided.

Furthermore, when the portable music player illustrated in FIG. 10B has an antenna, a microphone function, or a wireless communication function and is used with a mobile phone, a user can talk on the phone wirelessly in a hands-free way while driving a car or the like.

FIG. 10C illustrates a computer, which includes a main body 9201 including a CPU, a housing 9202, a display portion 9203, a keyboard 9204, an external connection port 9205, a pointing device 9206, and the like. The computer includes a semiconductor device manufactured according to one embodiment of the present invention for the display portion 9203. When the CPU described in Embodiment 5 is used, power consumption of the computer can be reduced.

Figure 11A:
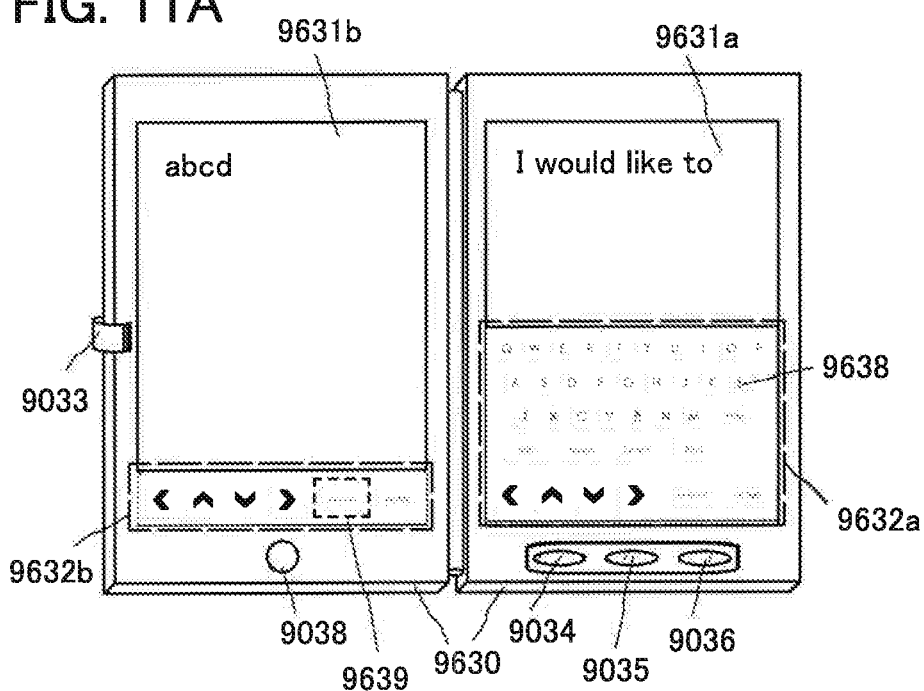
FIGS. 11A to 11C are views illustrating an electronic device.
Figure 11B:
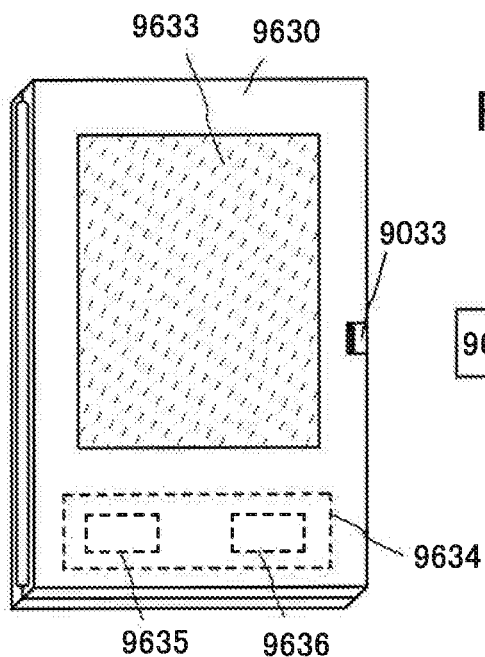

FIGS. 11A and 11B illustrate a tablet terminal that can be folded. In FIG. 11A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

In such a portable device illustrated in FIGS. 11A and 11B, an SRAM or a DRAM is used as a memory element for temporarily storing image data. For example, the semiconductor device described in Embodiment 2 or 3 can be used as a memory. The semiconductor device described in the above embodiment employed for the memory element enables writing and reading of data to be performed at high speed, enables data to be retained for a long time, and enables power consumption to be sufficiently reduced.

A touch panel region 9632a can be provided in a part of the display portion 9631a, in which data can be input by touching displayed operation keys 9638. Note that FIG. 11A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The display-mode switching button 9034 allows switching between a landscape mode and a portrait mode, color display and black-and-white display, and the like. With the power-saving-mode switching button 9036, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631a and the display portion 9631b have the same display size in FIG. 11A, one embodiment of the present invention is not limited to this example The display portion 9631a and the display portion 9631b may have different sizes or different display quality. For example, one of them may be a display panel that can display higher-definition images than the other.

FIG. 11B illustrates the tablet terminal folded, which includes the housing 9630, a solar cell 9633, a charge and discharge control circuit 9634, a battery 9635, and a DCDC converter 9636. Note that FIG. 11B shows an example in which the charge and discharge control circuit 9634 includes the battery 9635 and the DCDC converter 9636.

Since the tablet can be folded in two, the housing 9630 can be closed when the tablet is not in use. Thus, the display portions 9631a and 9631b can be protected, thereby providing a tablet with high endurance and high reliability for long-term use.

The tablet terminal illustrated in FIGS. 11A and 11B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633, which is attached on the surface of the tablet terminal, supplies electric power to a touch panel, a display portion, an image signal processor, and the like. Note that the solar cell 9633 can be provided on one or both surfaces of the housing 9630 and the battery 9635 can be charged efficiently. When a lithium ion battery is used as the battery 9635, there is an advantage of downsizing or the like.

Figure 11C:
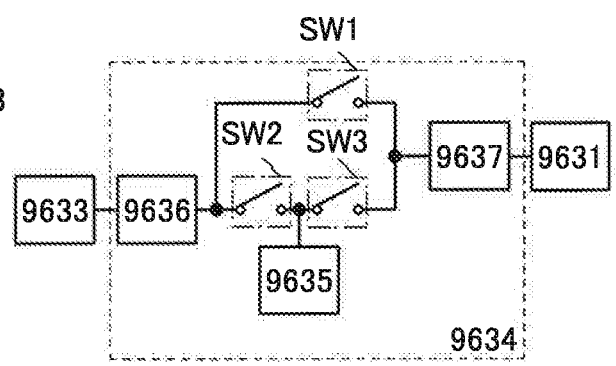

The structure and operation of the charge and discharge control circuit 9634 illustrated in FIG. 11B are described with reference to a block diagram of FIG. 11C. The solar cell 9633, the battery 9635, the DCDC converter 9636, a converter 9637, switches SW1 to SW3, and the display portion 9631 are illustrated in FIG. 11C, and the battery 9635, the DCDC converter 9636, the converter 9637, and the switches SW1 to SW3 correspond to the charge/discharge control circuit 9634 illustrated in FIG. 11B.

First, an example of operation in the case where power is generated by the solar cell 9633 using external light is described. The voltage of power generated by the solar cell 9633 is raised or lowered by the DCDC converter 9636 so that a voltage for charging the battery 9635 is obtained. When the display portion 9631 is operated with the power from the solar cell 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar cell 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 12A:
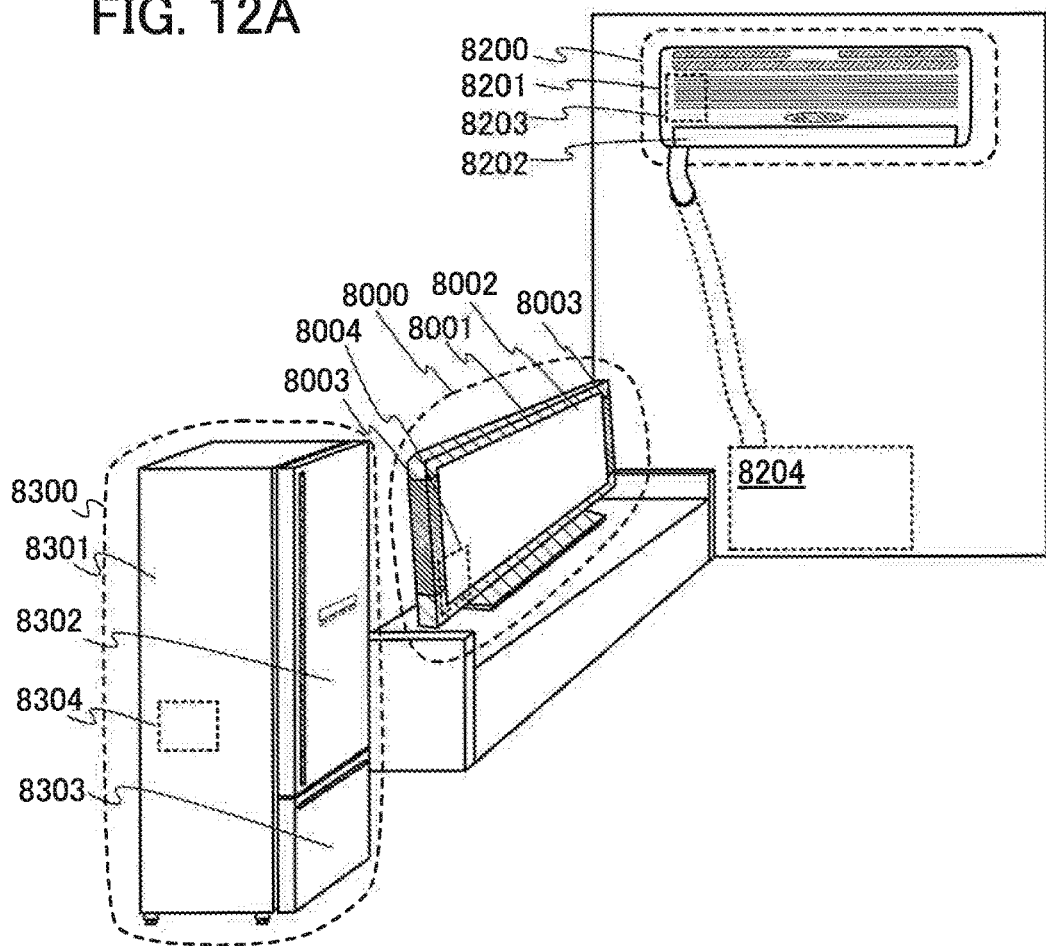
FIGS. 12A to 12C illustrate electronic devices.

In a television set 8000 in FIG. 12A, a display portion 8002 is incorporated in a housing 8001. The display portion 8002 displays an image and a speaker portion 8003 can output sound. The transistor described in Embodiment 1 can be used for the display portion 8002.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television set 8000 may be provided with a receiver, a modem, and the like. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The memory, the logic circuit, and the CPU described in any of Embodiments 2 to 5 can be used in the television set 8000.

In FIG. 12A, an air conditioner which includes an indoor unit 8200 and an outdoor unit 8204 is an example of an electric device in which the CPU of Embodiment 5 is used. Specifically, the indoor unit 8200 includes a housing 8201, an air outlet 8202, a CPU 8203, and the like. FIG. 12A shows the case where the CPU 8203 is provided in the indoor unit 8200; the CPU 8203 may be provided in the outdoor unit 8204. Alternatively, the CPU 8203 may be provided in both the indoor unit 8200 and the outdoor unit 8204. Since the CPU of Embodiment 5 is formed using an oxide semiconductor, an air conditioner which has excellent heat resistance property and high reliability can be provided with the use of the CPU.

In FIG. 12A, an electric refrigerator-freezer 8300 is an example of an electric device which is provided with the CPU formed using an oxide semiconductor. Specifically, the electric refrigerator-freezer 8300 includes a housing 8301, a door for a refrigerator 8302, a door for a freezer 8303, a CPU 8304, and the like. The CPU 8304 is provided in the housing 8301 in FIG. 12A. When the CPU described in Embodiment 5 is used as the CPU 8304 of the electric refrigerator-freezer 8300, power consumption of the electric refrigerator-freezer 8300 can be reduced.

Figure 12B:
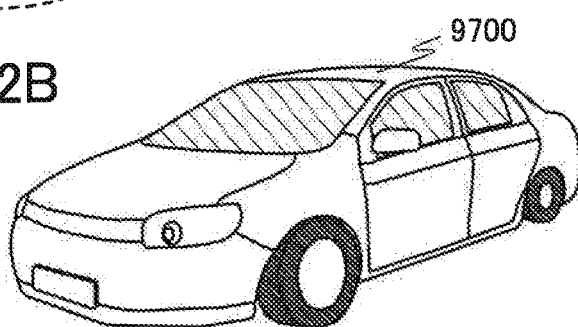
Figure 12C:
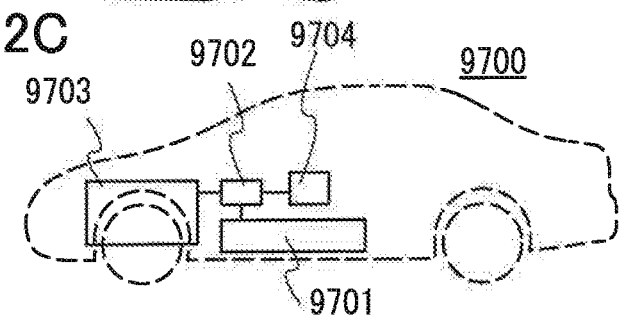

FIG. 12B illustrates an example of an electric vehicle which is an example of an electric device. An electric vehicle 9700 is equipped with a secondary battery 9701 (FIG. 12C). The output of power of the secondary battery 9701 is controlled by a control circuit 9702 and the power is supplied to a driving device 9703. The control circuit 9702 is controlled by a processing unit 9704 including a ROM, a RAM, a CPU, or the like which is not illustrated. When the CPU described in Embodiment 5 is used as the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

The methods and structures described in this embodiment can be combined as appropriate with any of the methods and structures described in the other embodiments.

This application is based on Japanese Patent Application serial no. 2012-104286 filed with Japan Patent Office on Apr. 30, 2012, the entire contents of which are hereby incorporated by reference.

What is claimed is:

1. A semiconductor device comprising:
a first insulating layer;
an oxide semiconductor layer over the first insulating layer;
a first electrode layer over and in contact with the oxide semiconductor layer;
a second electrode layer over and in contact with the oxide semiconductor layer;
a second insulating layer over the first electrode layer and the second electrode layer, the second insulating layer comprising an opening;
a third insulating layer over the second insulating layer and the oxide semiconductor layer, the third insulating layer being in contact with a part of the oxide semiconductor layer through the opening of the second insulating layer; and
a gate electrode layer over the third insulating layer, the gate electrode layer overlapping the part of the oxide semiconductor layer,
wherein the second insulating layer is in contact with the first insulating layer, and
wherein the opening of the second insulating layer and the part of the oxide semiconductor layer overlap each other.

2. The semiconductor device according to claim 1,
wherein the first electrode layer has a first thickness, and
wherein an edge of the first electrode layer has a second thickness smaller than the first thickness.

3. The semiconductor device according to claim 1,
wherein a width of the opening of the second insulating layer in a channel length direction is larger than a distance between the first electrode layer and the second electrode layer.

4. The semiconductor device according to claim 1,
wherein a width of the opening of the second insulating layer in a channel width direction is smaller than a width of the first electrode layer in the channel width direction.

5. The semiconductor device according to claim 1,
wherein the second insulating layer is one selected from the group consisting of a silicon oxide film, a silicon oxynitride film, an aluminum oxide film, an aluminum oxynitride film, a silicon nitride film, an aluminum nitride film, a silicon nitride oxide film and an aluminum nitride oxide film.

6. The semiconductor device according to claim 1, further comprising a third electrode layer under the oxide semiconductor layer with a fourth insulating layer therebetween.

7. The semiconductor device according to claim 6, further comprising a conductive layer under the first electrode layer with the fourth insulating layer therebetween.

8. A semiconductor device comprising:
a first insulating layer;
an oxide semiconductor layer over the first insulating layer;
a first electrode layer over and in contact with the oxide semiconductor layer;
a second electrode layer over and in contact with the oxide semiconductor layer;
a second insulating layer over the first electrode layer and the second electrode layer, the second insulating layer comprising an opening;
a third insulating layer over the second insulating layer and the oxide semiconductor layer, the third insulating layer being in contact with a part of the oxide semiconductor layer through the opening of the second insulating layer; and
a gate electrode layer over the third insulating layer, the gate electrode layer overlapping the part of the oxide semiconductor layer,
wherein the second insulating layer is in contact with the first insulating layer, and
wherein a side surface of the third insulating layer is aligned with a side surface of the gate electrode layer, and
wherein the opening of the second insulating layer and the part of the oxide semiconductor layer overlap each other.

9. The semiconductor device according to claim 8,
wherein the first electrode layer has a first thickness, and
wherein an edge of the first electrode layer has a second thickness smaller than the first thickness.

10. The semiconductor device according to claim 8,
wherein a width of the opening of the second insulating layer in a channel length direction is larger than a distance between the first electrode layer and the second electrode layer.

11. The semiconductor device according to claim 8,
wherein a width of the opening of the second insulating layer in a channel width direction is smaller than a width of the first electrode layer in the channel width direction.

12. The semiconductor device according to claim 8,
wherein the second insulating layer is one selected from the group consisting of a silicon oxide film, a silicon oxynitride film, an aluminum oxide film, an aluminum oxynitride film, a silicon nitride film, an aluminum nitride film, a silicon nitride oxide film and an aluminum nitride oxide film.

13. The semiconductor device according to claim 8, further comprising a third electrode layer under the oxide semiconductor layer with a fourth insulating layer therebetween.

14. The semiconductor device according to claim 13, further comprising a conductive layer under the first electrode layer with the fourth insulating layer therebetween.

15. A semiconductor device comprising:
a first insulating layer;
an oxide semiconductor layer over the first insulating layer;
a first electrode layer over and in contact with the oxide semiconductor layer;
a second electrode layer over and in contact with the oxide semiconductor layer;
a second insulating layer over the first electrode layer and the second electrode layer, the second insulating layer comprising an opening;
a third insulating layer over the second insulating layer and the oxide semiconductor layer, the third insulating layer being in contact with a part of the oxide semiconductor layer through the opening of the second insulating layer; and
a gate electrode layer over the third insulating layer, the gate electrode layer overlapping the part of the oxide semiconductor layer,
wherein the second insulating layer is in contact with the first insulating layer, and
wherein a thickness of the third insulating layer is smaller than a thickness of the second insulating layer, and wherein the opening of the second insulating layer and the part of the oxide semiconductor layer overlap each other.

16. The semiconductor device according to claim 15,
wherein the first electrode layer has a first thickness, and
wherein an edge of the first electrode layer has a second thickness smaller than the first thickness.

17. The semiconductor device according to claim 15,
wherein a width of the opening of the second insulating layer in a channel length direction is larger than a distance between the first electrode layer and the second electrode layer.

18. The semiconductor device according to claim 15,
wherein a width of the opening of the second insulating layer in a channel width direction is smaller than a width of the first electrode layer in the channel width direction.

19. The semiconductor device according to claim 15,
wherein the second insulating layer is one selected from the group consisting of a silicon oxide film, a silicon oxynitride film, an aluminum oxide film, an aluminum oxynitride film, a silicon nitride film, an aluminum nitride film, a silicon nitride oxide film and an aluminum nitride oxide film.

20. The semiconductor device according to claim 15, further comprising a third electrode layer under the oxide semiconductor layer with a fourth insulating layer therebetween.

21. The semiconductor device according to claim 20, further comprising a conductive layer under the first electrode layer with the fourth insulating layer therebetween.

22. The semiconductor device according to claim 15, further comprising a fifth insulating layer over the gate electrode layer, the fifth insulating layer being in contact with the second insulating layer.

* * * * *